(12) United States Patent
Nam et al.

(10) Patent No.: US 9,825,585 B2
(45) Date of Patent: Nov. 21, 2017

(54) SOLAR CELL MEASURING APPARATUS

(71) Applicant: LG ELECTRONICS INC., Seoul (KR)

(72) Inventors: Heejin Nam, Seoul (KR); Jaewon Chang, Seoul (KR); Hyunjung Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 408 days.

(21) Appl. No.: 14/559,487

(22) Filed: Dec. 3, 2014

(65) Prior Publication Data
US 2015/0155828 A1 Jun. 4, 2015

(30) Foreign Application Priority Data

Dec. 3, 2013 (KR) .................. 10-2013-0149389
Nov. 18, 2014 (KR) .................. 10-2014-0160544

(51) Int. Cl.
| | | |
|---|---|---|
| *G01R 31/26* | (2014.01) | |
| *H02S 50/10* | (2014.01) | |
| *G01R 19/00* | (2006.01) | |
| *H01L 31/0224* | (2006.01) | |
| *H01L 31/0747* | (2012.01) | |

(52) U.S. Cl.
CPC .......... *H02S 50/10* (2014.12); *G01R 19/0092* (2013.01); *H01L 31/022441* (2013.01); *H01L 31/0747* (2013.01); *Y02E 10/50* (2013.01)

(58) Field of Classification Search
CPC ............. H02S 50/10; G01R 19/0092; H01L 31/022441; H01L 31/0747; Y02E 10/50

USPC ..................................... 324/761.01; 365/201
See application file for complete search history.

(56) References Cited

U.S. PATENT DOCUMENTS

| | | | | |
|---|---|---|---|---|
| 2001/0040453 | A1* | 11/2001 | Toyomura | ............... H02S 50/10 |
| | | | | 324/332 |
| 2007/0068567 | A1 | 3/2007 | Rubin et al. | |
| 2009/0256581 | A1* | 10/2009 | Lu | ..................... H01L 21/67253 |
| | | | | 324/715 |
| 2010/0060305 | A1* | 3/2010 | Shin | ........................ H02S 50/10 |
| | | | | 324/754.01 |
| 2010/0201349 | A1* | 8/2010 | Taira | .................. G01R 31/2603 |
| | | | | 324/149 |

(Continued)

FOREIGN PATENT DOCUMENTS

| | | |
|---|---|---|
| CN | 102483437 A | 5/2012 |
| CN | 103063996 A | 4/2013 |

(Continued)

*Primary Examiner* — Viet Q Nguyen
(74) *Attorney, Agent, or Firm* — Birch, Stewart, Kolasch & Birch, LLP

(57) ABSTRACT

Discussed is a solar cell measuring apparatus to measure a current of a solar cell having a photoelectric converter and first and second electrodes electrically insulated from each other, both the first and second electrodes being located at one surface of the photoelectric converter. The solar cell measuring apparatus includes a measuring unit which includes a first measuring member corresponding to the first electrode and a second measuring member corresponding to the second electrode, wherein the first and second measuring members comes into close contact with the solar cell at the surface of the photoelectric converter to measure the current of the solar cell.

17 Claims, 13 Drawing Sheets

(56) References Cited

U.S. PATENT DOCUMENTS

| | | |
|---|---|---|
| 2012/0229156 A1 | 9/2012 | Vazzoler |
| 2012/0293182 A1 | 11/2012 | Buehler et al. |
| 2012/0306048 A1* | 12/2012 | Li .......................... G11C 17/16 |
| | | 257/529 |
| 2013/0019942 A1* | 1/2013 | Tachibana ........... H01L 31/0463 |
| | | 136/256 |
| 2013/0025668 A1 | 1/2013 | Adachi et al. |
| 2014/0239997 A1* | 8/2014 | Higuchi .................. H02S 50/10 |
| | | 324/756.03 |

FOREIGN PATENT DOCUMENTS

| | | |
|---|---|---|
| CN | 103229308 A | 7/2013 |
| EP | 2 650 925 A1 | 10/2013 |
| JP | 60-116181 A | 6/1985 |
| JP | 6-120305 A | 4/1994 |
| JP | 10-178192 A | 6/1998 |
| JP | 11-23656 A | 1/1999 |
| JP | 2001-298059 A | 10/2001 |
| JP | 2005-277055 A | 10/2005 |
| JP | 2007-304110 A | 11/2007 |
| JP | 2011-66231 A | 3/2011 |
| JP | 2011-71185 A | 4/2011 |
| JP | 2013-120842 A | 6/2013 |
| JP | 2013-195142 A | 9/2013 |
| JP | 2013-213795 A | 10/2013 |
| KR | 10-0154232 B1 | 12/1998 |
| KR | 10-2012-0087479 A | 8/2012 |
| KR | 10-1294860 B1 | 8/2013 |
| KR | 10-2013-0130012 A | 11/2013 |
| KR | 10-2014-0080493 A | 6/2014 |
| KR | 10-2015-0045871 A | 4/2015 |
| WO | WO 2012/036197 A1 | 3/2012 |
| WO | WO 2013/054855 A1 | 4/2013 |

* cited by examiner

SOLAR CELL MEASURING APPARATUS

CROSS-REFERENCE TO RELATED APPLICATION

This application claims priority to and the benefit of Korean Patent Application No. 10-2013-0149389, filed on Dec. 3, 2013 and Korean Patent Application No. 10-2014-0160544, filed on Nov. 18, 2014 in the Korean Intellectual Property Office, the disclosures of which are incorporated herein by reference.

BACKGROUND OF THE INVENTION

1. Field of the Invention

The embodiments of the invention relate to solar cell measuring apparatuses and, more particularly, to solar cell measuring apparatuses having an improved configuration.

2. Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy. Such solar cells may be fabricated by forming various layers and electrodes based on design. Solar cell efficiency may depend on the design of these layers and electrodes.

Whether or not solar cells have desired characteristics and efficiency may be judged using a variety of measuring apparatuses. Thereamong, methods of judging characteristics and the like of solar cells using measuring apparatuses that measure current (I)/voltage (V) characteristics of solar cells are widely used. These measuring apparatuses may check photoelectric conversion by measuring current generated via introduction of sunlight without application of voltage and also check diode characteristics of solar cells by measuring current during application of varying voltage.

Generally, measuring apparatuses for measurement of current include a bar extending by a long length in the length direction of an electrode included in a solar cell. The bar included in the measuring apparatuses is equipped with a plurality of measuring pins spaced apart from one another by a constant distance in the longitudinal direction of the electrode of the solar cell. Since the electrode of the solar cell includes a plurality of electrode portions, the pins mounted to the bar are positioned to come into contact with the electrode portions when arranged in the longitudinal direction of the electrode portions of the solar cell. In such a state, detection of current is performed on some of the pins while prescribed voltage is applied or not applied to the other pins.

However, the above-described measuring apparatuses have difficulty in accurately aligning each of the pins with a corresponding one of the electrode portions. In particular, in the instance of measuring current and voltage of solar cells in which electrode portions have smaller widths, pitches and the like, accurate alignment between the pins of the measuring apparatuses and the electrode portions may become more difficult. In addition, reduction in distances between the pins of the measuring apparatuses is limited, which makes it difficult, in some instances, to measure current and voltage of solar cells in which electrode portions have small widths, pitches and the like.

Meanwhile, conventional measuring apparatuses are devised based on the instances in which electrodes are located respectively at opposite sides of a board and have difficulty in being applied to the instances in which electrodes are located only at one side of a board.

SUMMARY OF THE INVENTION

Therefore, the embodiment of the invention has been made in view of the above problems, and it is one object of the embodiment of the invention to provide a solar cell measuring apparatus capable of precisely measuring characteristics of a solar cell without causing damage to the solar cell.

It is another object of the embodiment of the invention to provide a solar cell measuring apparatus capable of measuring characteristics of a solar cell in which electrode portions constituting an electrode have small widths and pitches.

It is a further object of the embodiment of the invention to provide a solar cell measuring apparatus capable of measuring characteristics of a solar cell when applied to a configuration in which electrodes are disposed only on one surface of a solar cell.

In accordance with an aspect of the embodiment of the invention, the above and other objects can be accomplished by the provision of a solar cell measuring apparatus to measure a current of a solar cell having a photoelectric converter and first and second electrodes electrically insulated from each other, both the first and second electrodes being located at one surface of the photoelectric converter, the solar cell measuring apparatus including a measuring unit including a first measuring member corresponding to the first electrode and a second measuring member corresponding to the second electrode, the first and second measuring members being configured to come into close contact with the solar cell at the surface of the photoelectric converter to measure current of the solar cell.

BRIEF DESCRIPTION OF THE DRAWINGS

The above and other objects, features and other advantages of the embodiment of the invention will be more clearly understood from the following detailed description taken in conjunction with the accompanying drawings, in which.

DETAILED DESCRIPTION OF THE EMBODIMENTS

Figure 1:
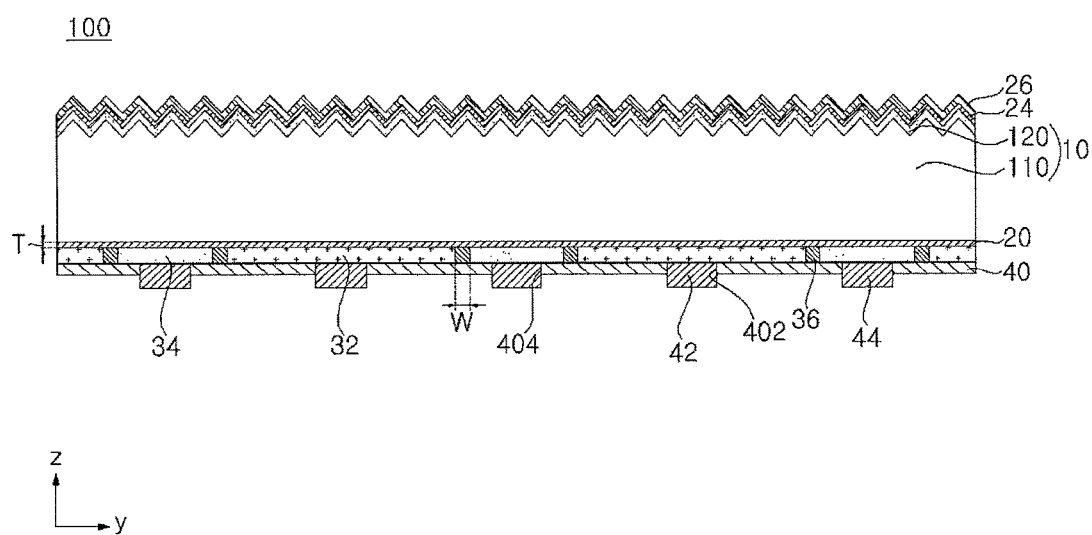
FIG. 1 is a sectional view showing one example of a solar cell, to which a solar cell measuring apparatus according to an embodiment of the invention may be applied.

Reference will now be made in detail to the example embodiments of the invention, examples of which are illustrated in the accompanying drawings. However, it will be understood that the invention should not be limited to the embodiments and may be modified in various ways.

In the drawings, to clearly and briefly explain the embodiment of the invention, illustration of elements having no connection with the description is omitted, and the same or similar elements are designated by the same reference numerals throughout the specification. In addition, in the drawings, for a more clear explanation, the dimensions of elements, such as thickness, width, and the like, are exaggerated or reduced, and thus the thickness, width, and the like of the embodiment of the invention are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, a solar cell measuring apparatus (hereinafter referred to as "measuring apparatus") according to an embodiment of the invention will be described in detail with reference to the accompanying drawings. After one example of a solar cell, characteristics of which may be measured by the measuring apparatus according to the embodiment of the invention, will first be described, the measuring apparatus according to the embodiment of the invention will be described in detail.

Figure 2:
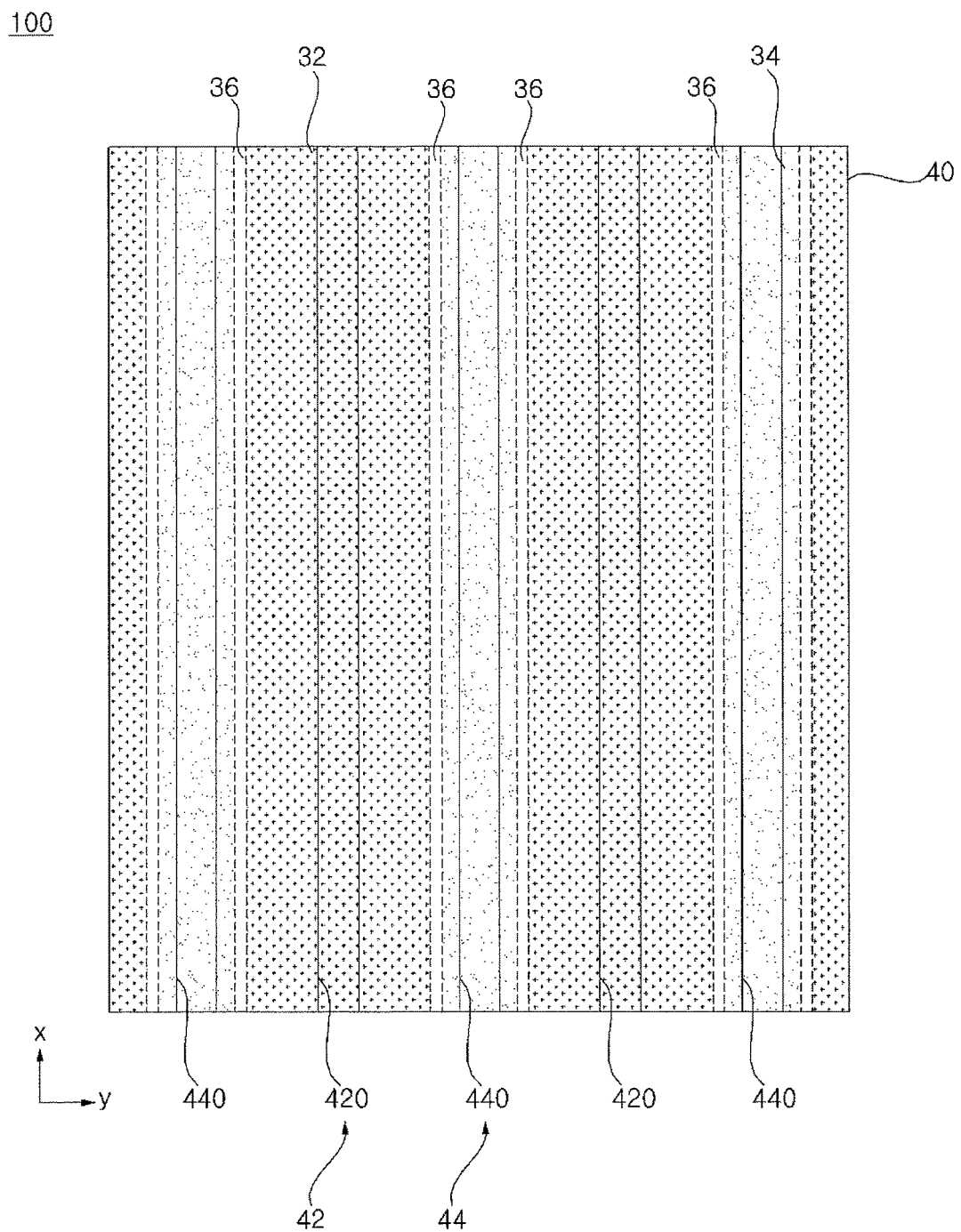
FIG. 2 is a rear plan view of the solar cell shown in FIG. 1.

FIG. 1 is a sectional view showing one example of a solar cell, to which a solar cell measuring apparatus according to an embodiment of the invention may be applied, and FIG. 2 is a rear plan view of the solar cell shown in FIG. 1.

Referring to FIGS. 1 and 2, the solar cell according to the embodiment of the invention, designated by reference numeral 100, includes a semiconductor substrate 10 having a base area 110, conductive areas 32 and 34 located at one surface of the semiconductor substrate 10 (e.g., a back surface of the semiconductor substrate 10), and electrodes 42 and 44 connected to the conductive areas 32 and 34. In addition, the solar cell 100 may further include a tunneling layer 20, a passivation film 24, an anti-reflection film 26, an insulation layer 40 and so on. This will be described below in more detail.

The semiconductor substrate 10 may include the base area 110 which contains a second conductive dopant at a relatively low doping concentration. In the embodiment of the invention, the base area 110 may comprise crystalline (single-crystal or polycrystal) silicon containing a second conductive dopant. For example, the base area 110 may be configured into a single-crystal silicon substrate (e.g., a single-crystal silicon wafer) containing a second conductive dopant. The second conductive dopant may be an n-type dopant or a p-type dopant. A group-V element, such as phosphorous (P), arsenic (As), bismuth (Bi), antimony (Sb), or the like, may be used as the n-type dopant, and a group-III element, such as boron (B), aluminum (A), gallium (Ga), Indium (In), or the like, may be used as the p-type dopant. For example, assuming that the base area 110 is n-type, p-type first conductive areas 32 may be formed over a wide surface area to increase a photoelectric conversion surface area because the p-type first conductive areas 32 and the n-type base area 110 create junctions (e.g., p-n junctions with the tunneling layer 20 interposed therebetween) for production of carriers via photoelectric conversion. In addition, in this instance, the first conductive areas 32 having a wide surface area may effectively collect holes having relatively low mobility, thereby contributing to enhancement in photoelectric conversion efficiency. However, the embodiment of the invention is not limited thereto.

In addition, the semiconductor substrate 10 may further include a front-surface electric-field area 120 located at a front surface thereof. The front-surface electric-field area 120 may have the same surface area as that of the base area 110 and a greater doping concentration than that of the base area 110.

The embodiment of the invention illustrates that the front-surface electric-field area 120 is configured into a doping area formed by doping the semiconductor substrate 10 with the second conductive dopant in a relatively high doping concentration. As such, the front-surface electric-field area 120 comprises a second conductive crystalline (single-crystal or polycrystal) semiconductor to constitute the semiconductor substrate 10. For example, the front-surface electric-field area 120 may be part of a second conductive single-crystal semiconductor substrate (e.g., a single-crystal silicon wafer). However, the embodiment of the invention is not limited thereto. Accordingly, the semiconductor substrate 10 and another separate semiconductor layer (e.g., an amorphous semiconductor layer, a microcrystalline semiconductor layer, or a polycrystalline semiconductor layer) may be doped with a second conductive dopant to form the front-surface electric-field area 120. Alternatively, the front-surface electric-field area 120 may be configured into an electric-field area that functions similar to a layer that is formed in proximity to the semiconductor substrate 10 (such as, for example, the passivation film 24 and/or the anti-reflection film 26) doped by a fixed charge. In addition, the front-surface electric-field area 120 may have conductive type opposite that of the base area 110. Various configurations of the front-surface electric-field area 120 may be acquired via various other methods.

In the embodiment of the invention, the front surface of the semiconductor substrate 10 may be subjected to texturing to attain bosses and recesses having a pyramidal shape and the like. Providing the front surface of the semiconductor substrate 10 with the bosses and recesses by texturing may reduce reflectance of incident light to the front surface of the semiconductor substrate 10. Consequently, the quantity of light reaching the p-n junctions at an interface of the base area 110 and the first conductive areas 32 may be increased, which may result in minimized light loss.

The back surface of the semiconductor substrate 10 may be a relatively smooth and flat surface having a lower surface roughness than that of the front surface, the relatively smooth and flat back surface being formed by mirror finish polishing or the like. This is because characteristics of the solar cell 100 may greatly vary according to characteristics of the back surface of the semiconductor substrate 10 in the instance in which both the first and second conductive areas 32 and 34 are formed at the back surface of the semiconductor substrate 10 as in the embodiment of the invention. Accordingly, the rear surface of the semiconductor substrate 10 is not provided with bosses and recesses by texturing, thus achieving improved passivation and, consequently, improving characteristics of the solar cell 100. However, the embodiment of the invention is not limited thereto and the back surface of the semiconductor substrate 10 may be provided with bosses and recesses by texturing in some instances. Various other alterations are also possible.

The tunneling layer 20 is formed over the back surface of the semiconductor substrate 10. The tunneling layer 20 may provide the back surface of the semiconductor substrate 10 with improved interface characteristics and permit smooth transfer of carriers produced by photoelectric conversion via tunneling effects. The tunneling layer 20 may comprise any of various materials for tunneling of carriers, such as, for example, oxides, nitrides, semiconductors, and conductive polymers. For example, the tunneling layer 20 may comprise silicon oxides, silicon nitrides, silicon oxide nitrides, intrinsic amorphous silicon, and intrinsic polycrystal silicon. In this instance, the tunneling layer 20 may be formed throughout the back surface of the semiconductor substrate 10. In this way, the back surface of the semiconductor substrate 10 may be wholly passivated and easily formed without separate patterning.

To achieve sufficient tunneling effects, a thickness T of the tunneling layer 20 may be less than a thickness of the insulation layer 40. For example, the thickness T of the tunneling layer 20 may be 10 nm or less and, particularly, be within a range of 0.5 nm to 10 nm (more particularly, be within a range of 0.5 nm to 5 nm, such as, for example, a range of 1 nm to 4 nm). When the thickness T of the tunneling layer 20 exceeds 10 nm, tunneling may not smoothly occur, causing the solar cell 100 not to operate. When the thickness T of the tunneling layer 20 is below 0.5 nm, it is difficult to achieve desired qualities of the tunneling layer 20. To achieve improved tunneling effects, the thickness T of the tunneling layer 20 may be within a range of 0.5 nm to 5 nm (more particularly, a range of 1 nm to 4 nm). However, the embodiment of the invention is not limited thereto and the thickness T of the tunneling layer 20 may have any of various other values.

The conductive areas 32 and 34 may be located over the tunneling layer 20. More specifically, the conductive areas 32 and 34 may include the first conductive areas 32 that contain a first conductive dopant to exhibit the first conductive type and the second conductive areas 34 that contain a second conductive dopant to exhibit the second conductive type. In addition, barrier areas 36 may be located between the first conductive areas 32 and the second conductive areas 34.

The first conductive areas 32 configure an emitter area that creates p-n junctions (or p-n tunnel junctions) to produce carriers via photoelectric conversion in conjunction with the base area 110 with the tunneling layer 20 interposed therebetween.

In this instance, the first conductive areas 32 may comprise a semiconductor (e.g., silicon) containing a first conductive dopant opposite that of the base area 110. In the present embodiment of the invention, the first conductive areas 32 are configured into a semiconductor layer that is formed over and separated from the semiconductor substrate 10 (more particularly, formed over the tunneling layer 20) and doped with a first conductive dopant. As such, the first conductive areas 32 may be configured into a semiconductor layer having a crystalline structure different from that of the semiconductor substrate 10, so as to be easily formed over the semiconductor substrate 10. For example, the first conductive areas 32 may be formed by doping an amorphous semiconductor, a microcrystalline semiconductor, or a polycrystalline semiconductor (e.g., amorphous silicon, microcrystal silicon or polycrystal silicon), which may be easily prepared via any of various methods, such as, for example, deposition, with a first conductive dopant. After the semiconductor layer is formed, the first conductive dopant may be included in the semiconductor layer via any of various doping methods.

In this instance, the first conductive dopant is simply a dopant that may exhibit a conductive type opposite that of the base area 110. That is, when the first conductive dopant is a p-type dopant, a group-III element, such as boron (B), aluminum (A), gallium (Ga), Indium (In), or the like, may be used. When the first conductive dopant is an n-type dopant, a group-V element, such as phosphorous (P), arsenic (As), bismuth (Bi), antimony (Sb), or the like, may be used.

The second conductive areas 34 configure a back-surface electric-field area that creates a back-surface electric-field to prevent loss of carriers due to recombination at a surface of the semiconductor substrate 10 (more particularly, at the back surface of the semiconductor substrate 10).

In this instance, the second conductive areas 34 may comprise a semiconductor (e.g., silicon) containing the same second conductive dopant as that of the base area 110. In the embodiment of the invention, the second conductive areas 34 are configured into a semiconductor layer that is formed over and separated from the semiconductor substrate 10 (more particularly, formed over the tunneling layer 20) and doped with a second conductive dopant. As such, the second conductive areas 34 may be configured into a semiconductor layer having a crystalline structure different from that of the semiconductor substrate 10, so as to be easily formed over the semiconductor substrate 10. For example, the second conductive areas 34 may be formed by doping an amorphous semiconductor, a microcrystalline semiconductor, or a polycrystalline semiconductor (e.g., amorphous silicon, microcrystal silicon or polycrystal silicon), which may be easily prepared via any of various methods, such as, for example, deposition, with a second conductive dopant. After the semiconductor layer is formed, the second conductive dopant may be included in the semiconductor layer via any of various doping methods.

In this instance, the second conductive dopant is simply a dopant that may exhibit the same conductive type as the base area 110. That is, when the second conductive dopant is an n-type dopant, a group-V element, such as phosphorous (P), arsenic (As), bismuth (Bi), antimony (Sb), or the like, may be used. When the second conductive dopant is a p-type dopant, a group-III element, such as boron (B), aluminum (A), gallium (Ga), Indium (In), or the like, may be used.

The barrier areas 36 are located between the first conductive areas 32 and the second conductive areas 34 to space the first conductive areas 32 and the second conductive areas 34 apart from each other. When the first conductive areas 32 and the second conductive areas 34 come into contact with each other, shunting may occur, causing deterioration in the performance of the solar cell 100. Accordingly, in the embodiment of the invention, it is possible to prevent unnecessary shunting by positioning the barrier areas 36 between the first conductive areas 32 and the second conductive areas 34.

The barrier areas 36 may comprise any of various materials that may substantially insulate the first conductive areas 32 and the second conductive areas 34 from each other. That is, the barrier areas 36 may be formed of an undoped insulating material (e.g., oxides and nitrides). Alternatively, the barrier areas 36 may be configured into an intrinsic area containing an intrinsic semiconductor. In this instance, the first conductive areas 32, the second conductive areas 34 and the barrier areas 36 may be disposed on the same plane, may have substantially the same thickness, may be formed of the same semiconductor (e.g., amorphous silicon, microcrystal silicon, or polycrystal silicon), and may have substantially no dopant. For example, when a semiconductor layer containing a semiconductor material is formed and, thereafter, the first conductive areas 32 are formed by doping part of the semiconductor layer with a first conductive dopant and the second conductive areas 34 are formed by doping part of the remaining semiconductor layer with a second conductive dopant, the remaining part of the semiconductor layer where the first conductive areas 32 and the second conductive areas 34 are not formed may configure the barrier areas 36. In this way, preparation of the first conductive areas 32, the second conductive areas 34 and the barrier areas 36 may be simplified.

For example, a width W of the barrier areas 36 (or a distance between the first conductive areas 32 and the second conductive areas 34) may be within a range of 1 μm to 100 μm. When the width W of the barrier areas 36 is below 1 μm, this may cause difficulty in fabrication due to the nature of fabrication processes and be insufficient to prevent shunting. When the width W of the barrier areas 36 exceeds 100 μm, a surface area of the barrier areas 36 increases and, correspondingly, a surface area of the first and second conductive areas 32 and 34 is reduced, which may cause deterioration in efficiency of the solar cell 100. However, the embodiment of the invention is not limited thereto and the width W of the barrier areas 36 may have any of various other values.

It should be noted that the embodiment of the invention is not limited to the above description. Accordingly, when the barrier areas 36 are formed separately from the first conductive areas 32 and the second conductive areas 34, a thickness of the barrier areas 36 may be different from that of the first conductive areas 32 and the second conductive areas 34. For example, the barrier areas 36 may be thicker than the first conductive areas 32 and the second conductive areas 34, in order to more effectively prevent electrical short of the first conductive areas 32 and the second conductive areas 34. Alternatively, the barrier areas 36 may be thinner than the first conductive areas 32 and the second conductive areas 34, in order to reduce material costs for the barrier areas 36. Of course, various other alterations are also possible. In addition, a basic constituent material of the barrier areas 36 may be different from that of the first conductive areas 32 and the second conductive areas 34. Alternatively, the barrier areas 36 may be configured into an empty space (e.g., a trench) located between the first conductive areas 32 and the second conductive areas 34.

Each of the barrier areas 36 may be configured to space the first conductive area 32 and the second conductive area 34 apart from each other at only part of a boundary therebetween. As such, the first conductive area 32 and the second conductive area 34 may come into contact with each other at the remaining boundary therebetween. In addition, the barrier area 36 may be unnecessary and the first conductive area 32 and the second conductive area 34 may wholly come into contact with each other. Various other alterations are also possible.

In the embodiment of the invention, the first conductive areas 32, which have different conductive type from that of the base area 110, may have a greater surface area than that of the second conductive areas 34 that have the same conductive type as that of the base area 110. This may permit creation of wider p-n junctions between the base area 110 and the first conductive areas 32 through the tunneling layer 20. In this instance, when the base area 110 and the second conductive areas 34 are n-type and the first conductive areas 32 are p-type, the greater surface area of the first conductive areas 32 may effectively collect holes having relatively low mobility. Planar shapes of the first conductive areas 32, the second conductive areas 34 and the barrier areas 36 will be described below in more detail with reference to FIG. 2.

The embodiment of the invention illustrates that the conductive areas 32 and 34 are located at the back surface of the semiconductor substrate 10 with the tunneling layer 20 interposed therebetween. However, the embodiment of the invention is not limited thereto, and the conductive areas 32 and 34 may be configured into a doping area formed by doping the semiconductor substrate 10 with a dopant without the tunneling layer 20. That is, the conductive areas 32 and 34 may be configured into a doping area having a single-crystal semiconductor structure that constitutes part of the semiconductor substrate 10. The conductive areas 32 and 34 may be formed by any of various other methods.

The insulation layer 40 may be formed over the first conductive areas 32, the second conductive areas 34 and the barrier areas 36. The insulation layer 40 may have the effect of preventing the first conductive areas 34 and the second conductive areas 34 from being connected to electrodes that should not be connected or should be insulated (e.g., misconnection of the first conductive areas 32 to the second electrode 44 and misconnection of the second conductive areas 34 to the first electrode 42) and may also have the effect of causing passivation of the first conductive areas 32 and the second conductive areas 34. The insulation layer 40 has first openings 402 to expose the first conductive areas 32 and second openings 404 to expose the second conductive areas 34.

The insulation layer 40 as described above may have a thickness equal to or greater than that of the tunneling layer 20. This may result in improved insulation and passivation characteristics. The insulation layer 40 may be formed of any of various insulating materials (e.g., oxides and nitrides). For example, the insulation layer 40 may have a single-layer structure or a multi-layer structure in the form of a combination of two or more layers formed of at least one material selected from the group consisting of silicon nitride, silicon nitride containing hydrogen, silicon oxide, silicon oxide nitride film, $Al_2O_3$, $MgF_2$, ZnS, $TiO_2$ and $CeO_2$. However, of course, the embodiment of the invention is not limited thereto and the insulation layer 40 may comprises any of various other materials.

The electrodes 42 and 44, located at the back surface of the semiconductor substrate 10, include the first electrode 42 that is electrically and physically connected to the first conductive areas 32 and the second electrode 44 that is electrically and physically connected to the second conductive areas 34.

In this instance, the first electrode 42 is connected to the first conductive areas 32 through the first openings 402 of the insulation layer 40, and the second electrode 44 is connected to the second conductive areas 34 through the second opening 404 of the insulation layer 40. The first and second electrodes 42 and 44 may respectively comprise any of various metal materials. In addition, the first and second electrodes 42 and 44 may have any of various planar shapes to allow the first and second electrodes 42 and 44 to be connected respectively to the first conductive areas 32 and the second conductive areas 34 while not being electrically connected to each other for collection of produced carriers and transmission of the carriers to the outside. That is, the embodiment of the invention is not limited to the above-described planar shapes of the first and second electrodes 42 and 44.

Hereinafter, planar shapes of the first conductive areas 32, the second conductive areas 34, the barrier areas 36, and the first and second electrodes 42 and 44 will be described in detail with reference to FIG. 2.

Referring to FIG. 2, in the embodiment of the invention, the first conductive areas 32 and the second conductive areas 34 are elongated in stripe shapes and alternately arranged in a direction crossing the longitudinal direction thereof. Each barrier area 36 may be located between the first conductive area 32 and the second conductive area 34 to space the first conductive area 32 and the second conductive area 34 apart from each other. The first conductive areas 32 spaced apart from one another may be connected to one another for those located at one end of the solar cell 100, and the second conductive areas 34 spaced apart from one another may be connected to one another for those located at the other end of the solar cell 100. However, the embodiment of the invention is not limited thereto.

In this instance, a surface area of the first conductive areas 32 may be greater than a surface area of the second conductive areas 34. For example, the surface areas of the first conductive areas 32 and the second conductive areas 34 may be regulated by providing the first conductive areas 32 and the second conductive areas 34 with different widths. That is, a width of the first conductive areas 32 may be greater than a width of the second conductive areas 34. This may provide a sufficient surface area of the first conductive areas 32 that configure an emitter area, thereby permitting occurrence of photoelectric conversion at a wide area. In this instance, when the first conductive areas 32 are p-type, the first conductive areas 32 having a sufficient surface area may effectively collect holes having relatively low mobility.

The first electrode 42 may include a plurality of first electrode portions 420 arranged in parallel into stripe shapes to correspond to the first conductive areas 32. The second electrode 44 may include a plurality of second electrode portions 440 arranged in parallel into stripe shapes to correspond to the second conductive areas 34. The first electrode portions 420 and the second electrode portions 440 may be alternately located one by one in a direction crossing the longitudinal direction thereof (along the y-axis in the drawing).

The first and second openings (see reference numerals 402 and 404 in FIG. 1) may be formed over the entire surface area of the first and second electrode portions 420 and 440 to correspond to the first and second electrode portions 420 and 440 of the first and second electrodes 42 and 44 respectively. This may maximize a contact surface area between the first and second electrodes 42 and 44 and the first conductive areas 32 and the second conductive areas 34, thereby improving carrier collection efficiency. However, the embodiment of the invention is not limited thereto. Of course, the first and second openings 402 and 404 may be formed to connect only parts of the first and second electrode portions 420 and 440 to the first conductive areas 32 and the second conductive areas 34 respectively. For example, the first and second openings 402 and 404 may be a plurality of contact holes formed respectively at positions corresponding to the first and second electrode portions 420 and 440. In addition, the first electrode portions 420 of the first electrode 42 may be connected to one another at one end of the solar cell 100 by other electrode portions, and the second electrode portions 440 of the second electrode 44 may be connected to one another at the other end of the solar cell 100 by other electrode portions. However, the embodiment of the invention is not limited thereto.

Figure 3:
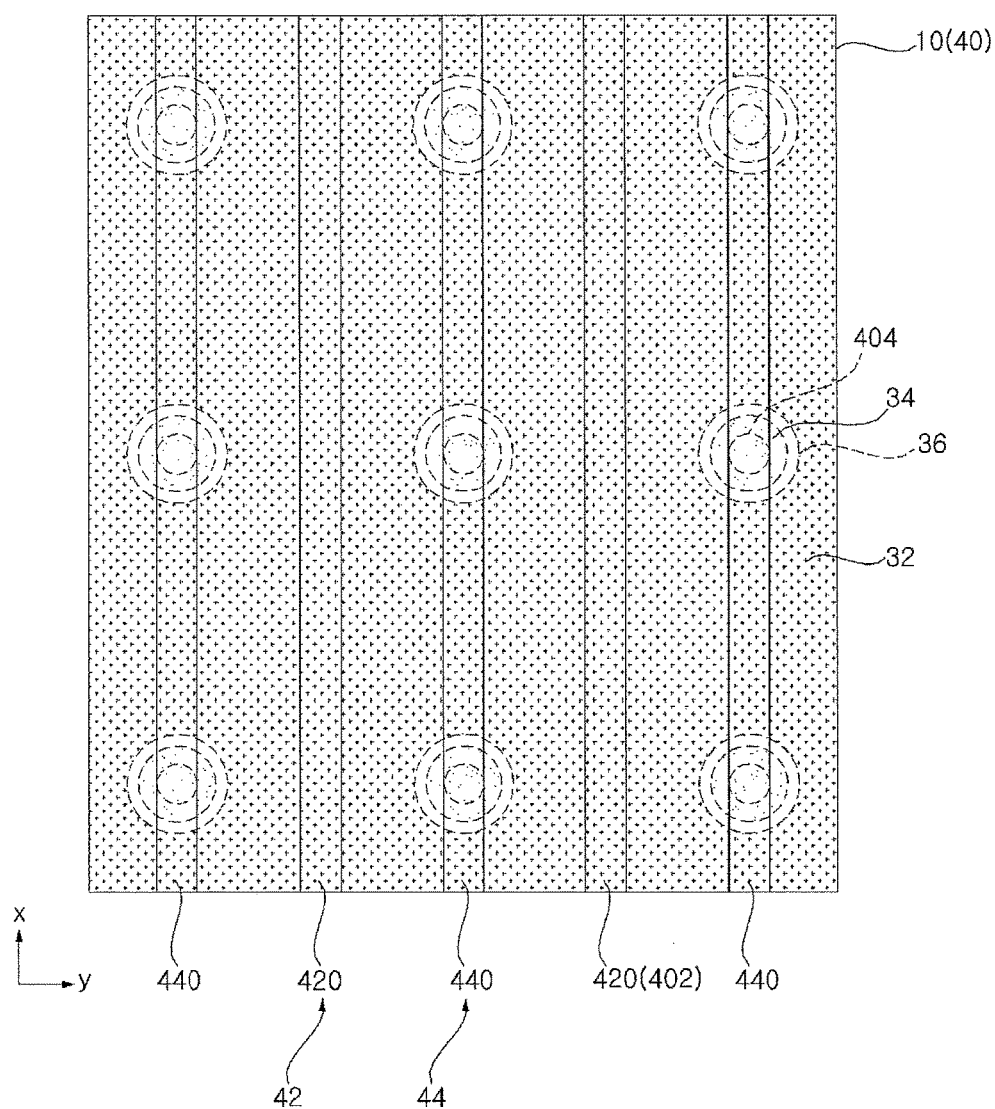
FIG. 3 is a partial rear plan view showing another example of the solar cell, to which the solar cell measuring apparatus according to the embodiment of the invention may be applied.

It should be noted that the embodiment of the invention is not limited to the above description. Thus, arrangement of the first and second conductive areas 32 and 34 and the barrier areas 36 may be altered in various ways. For example, an alteration as shown by example in FIG. 3 is possible. This will be described below in detail with reference to FIG. 3. FIG. 3 is a partial rear plan view showing another example of the solar cell, to which a solar cell measuring apparatus according to an embodiment of the invention may be applied.

Referring to FIG. 3, the solar cell 100 according to the embodiment of the invention may include a plurality of second conductive areas 34 in the form of islands spaced apart from one another, barrier areas 36 respectively surrounding the second conductive areas 34, and a first conductive area 32 formed throughout the remaining part of the solar cell 100 except for the second conductive areas 34 and the barrier areas 36. As such, the first conductive area 32 may have holes or openings respectively corresponding to the second conductive areas 34 and the barrier areas 36 surrounding the second conductive areas 34.

With the above-described configuration, the first conductive area 32 may achieve the maximum wide surface area, thus causing enhanced photoelectric conversion efficiency. In addition, this configuration may allow the second conductive areas 34 to be distributed throughout the semiconductor substrate 10 while minimizing a surface area of the second conductive areas 34. Thereby, the second conductive areas 34 may have a minimum surface area sufficient to effectively prevent surface recombination. However, the embodiment of the invention is not limited thereto, and the second conductive areas 34 may have any of various other shapes to minimize a surface area thereof.

In this instance, the second conductive areas 34 may take the form of islands, and the barrier areas 36 may take the form of a closed ring extending around an edge of each second conductive area 34. For example, when the second conductive area 34 has a circular shape, the barrier layer 36 may have an annular shape. However, the embodiment of the invention is not limited thereto and the first and second conductive areas 32 and 34 may have any of various other shapes.

While the drawing illustrates the circular second conductive areas 34, the embodiment of the invention is not limited thereto. Thus, the second conductive areas 34 may respectively have an oval shape, or a polygonal shape such as a triangular, rectangular, or hexagonal shape. In addition, arrangement of the second conductive areas 34 may be altered in various ways.

The first electrode 42 may include the first electrode portions 420 arranged in parallel into stripe shapes to correspond to the first conductive area 32. The second electrode 44 may include the second electrode portions 440 arranged in parallel into stripe shapes to correspond to the second conductive areas 34. While the drawing illustrates that the first electrode portions 420 are spaced apart from one another and the second electrode portions 440 are spaced apart from one another, the embodiment of the invention is not limited thereto. That is, the first electrode portions 420 may be connected to one another at one end of the solar cell 100, and the second electrode portions 440 may be connected to one another at the other end of the solar cell 100. Various other alterations are also possible.

The first and second openings 402 and 404, formed in the insulation layer 40, may have different shapes in consideration of respective shapes of the first conductive area 32 and the second conductive areas 34. That is, the first openings 402 may be elongated openings over the first conductive area 32, and the second openings 404 may be spaced apart from one another to correspond to the second conductive areas 34. This is based on the fact that the first electrode 42 is located only over the first conductive area 32 and the second electrode 44 is located over both the first conductive area 32 and the second conductive areas 34. That is, the second openings 404 are formed in the insulation layer 40 at positions corresponding to the respective second conductive areas 34, and the second electrode 44 is connected to the second conductive areas 34 through the second openings 404. In addition, the second openings 404 are not formed in part of the insulation layer 40 corresponding to the first conductive area 32, which allows the second electrode 44 and the first conductive area 32 to be insulated from each other. The first openings 402 may have the same or similar shape as the first electrode 42 because the first electrode 42 is formed only over the first conductive area 32, which allows the first electrode 42 to wholly come into contact with the first conductive area 32. However, the embodiment of the invention is not limited thereto and various other alterations are possible. For example, the first opening 402 may include a plurality of contact holes having a shape similar to that of the second openings 404.

Referring again to FIG. 1, the passivation film 24 and/or the anti-reflection film 26 may be disposed over the front surface of the semiconductor substrate 10 (more particularly, over the front-surface electric-field area 120 formed at the front surface of the semiconductor substrate 10). In some embodiments, only the passivation film 24 may be formed over the semiconductor substrate 10, and only the anti-reflection film 26 may be formed over the semiconductor substrate 10. Alternatively, the passivation film 24 and the anti-reflection film 26 may be disposed in sequence over the semiconductor substrate 10. The drawing illustrates that the passivation film 24 and the anti-reflection film 26 are sequentially formed over the semiconductor substrate 10 such that the semiconductor substrate 10 comes into contact with the passivation film 24. However, the embodiment of the invention is not limited thereto, and the semiconductor substrate 10 may come into contact with the anti-reflection film 26. Various other alterations are also possible.

The passivation film 24 and the anti-reflection film 26 may substantially be formed throughout the front surface of the semiconductor substrate 10. In this instance, "formed throughout" includes not only physically complete formation, but also formation with inevitably excluded parts.

The passivation film 24 is formed to come into contact with the front surface of the semiconductor substrate 10 to passivate flaws present in the front surface or bulk of the semiconductor substrate 10. This passivation may remove recombination sites of minority carriers, thereby increasing open-circuit voltage of the solar cell 100. The anti-reflection film 26 serves to reduce reflectance of incident light to the front surface of the semiconductor substrate 10. Such reduction in the reflectance of incident light to the front surface of the semiconductor substrate 10 may increase the quantity of light reaching p-n junctions formed at an interface between the base area 110 and the first conductive area 32. This may increase short-circuit current $I_{sc}$ of the solar cell 100. In this way, the passivation film 24 and the anti-reflection film 26 may increase the open-circuit voltage and the short-circuit current of the solar cell 100, thereby improving efficiency of the solar cell 100.

The passivation film 24 and/or the anti-reflection film 26 may be formed of any of various materials. For example, the passivation film 24 may have a single-layer structure or a multi-layer structure in the form of a combination of two or more layers formed of at least one material selected from the group consisting of silicon nitride, silicon nitride containing hydrogen, silicon oxide, silicon oxide nitride, aluminum oxide, $MgF_2$, ZnS, $TiO_2$ and $CeO_2$. For example, the passivation film 24 may comprise silicon oxide and the anti-reflection film 26 may comprise silicon nitride.

When light is introduced into the solar cell 100 according to the embodiment of the invention, holes and electrodes are produced by photoelectric conversion at the p-n junctions between the base area 110 and the first conductive area 32. Then, the produced holes and electrodes move to the first conductive area 32 and the second conductive areas 34 via tunneling through the tunneling layer 20 and, subsequently, move to the first and second electrodes 42 and 44. Thereby, electrical energy is produced.

In the solar cell 100 having a back-surface electrode structure in which the electrodes 42 and 44 are formed at the back surface of the semiconductor substrate 10 and no electrodes are formed at the front surface of the semiconductor substrate 10, and shading loss at the front surface of the semiconductor substrate 10 may be minimized. This may enhance efficiency of the solar cell 100. However, the embodiment of the invention is not limited thereto, and may be applied to a solar cell in which the first electrode 42 is located at the front surface of the semiconductor substrate 10 and the second electrode 44 is located at the back surface of the semiconductor substrate 10.

In the solar cell 100 having a back-surface electrode structure as described above, it is desirable that the first electrode portions 420 constituting the first electrode 42 and the second electrode portions 440 constituting the second electrode 44 be densely arranged because the first electrode 42 and the second electrode 44 are disposed on the same surface. Accordingly, a width and pitch of the first electrode portions 420 constituting the first electrode 42, a width and pitch of the second electrode portions 440 constituting the second electrode 44, and a distance between the first electrode portion 420 and the second electrode portion 440 are reduced. This may cause difficulty in measurement of current-voltage characteristics of the solar cell 100 using conventional measuring apparatuses. In consideration of this problem, a measuring apparatus according to the embodiment of the invention, designated by reference numeral 200, may be configured to enable precise measurement for the solar cell 100 having a back-surface electrode structure. The measuring apparatus 200 according to the embodiment of the invention will be described below in more detail with reference to FIGS. 4 to 6.

Figure 4:
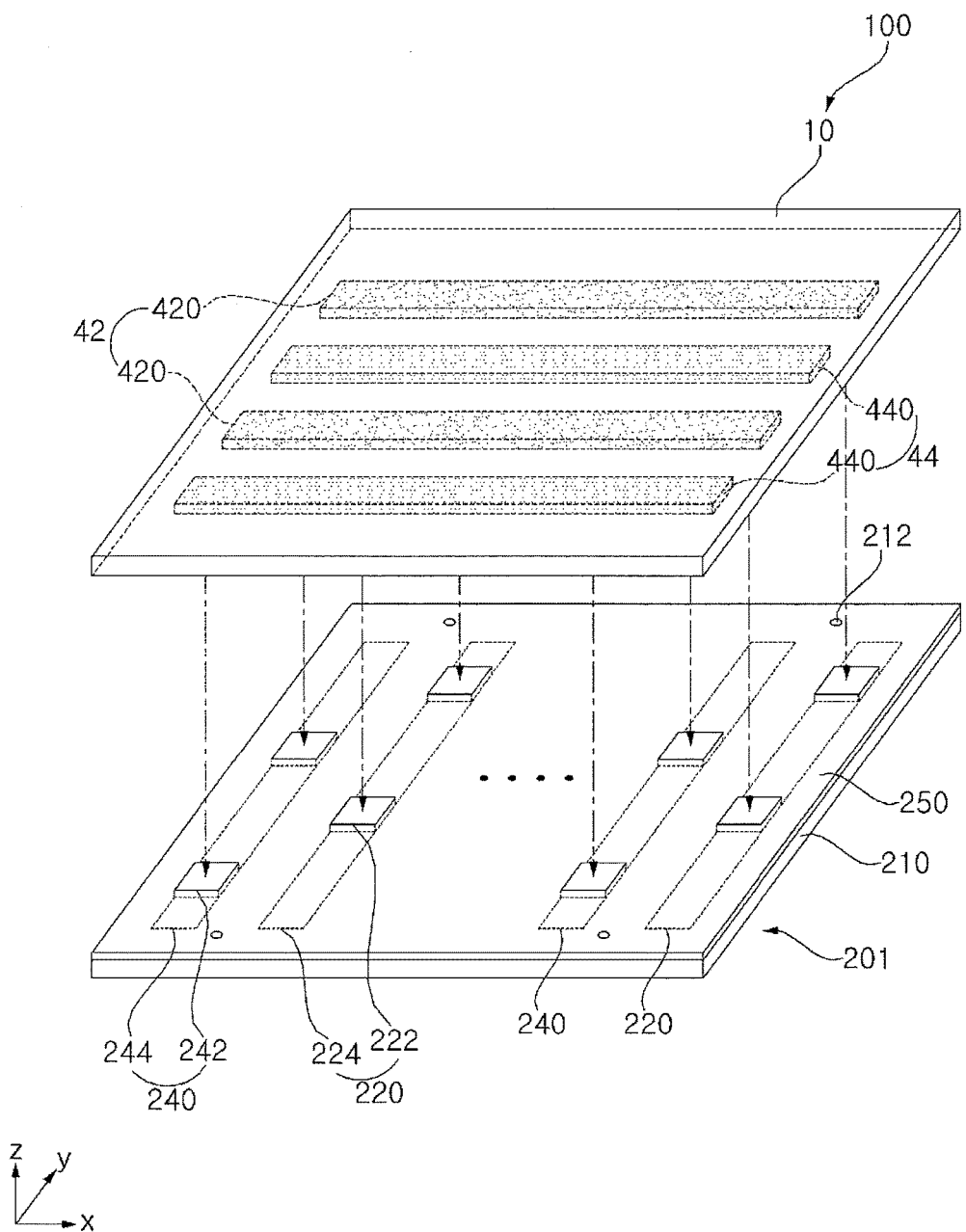
FIG. 4 is a perspective view schematically showing the solar cell as well as the measuring apparatus according to the embodiment of the invention.
Figure 5:
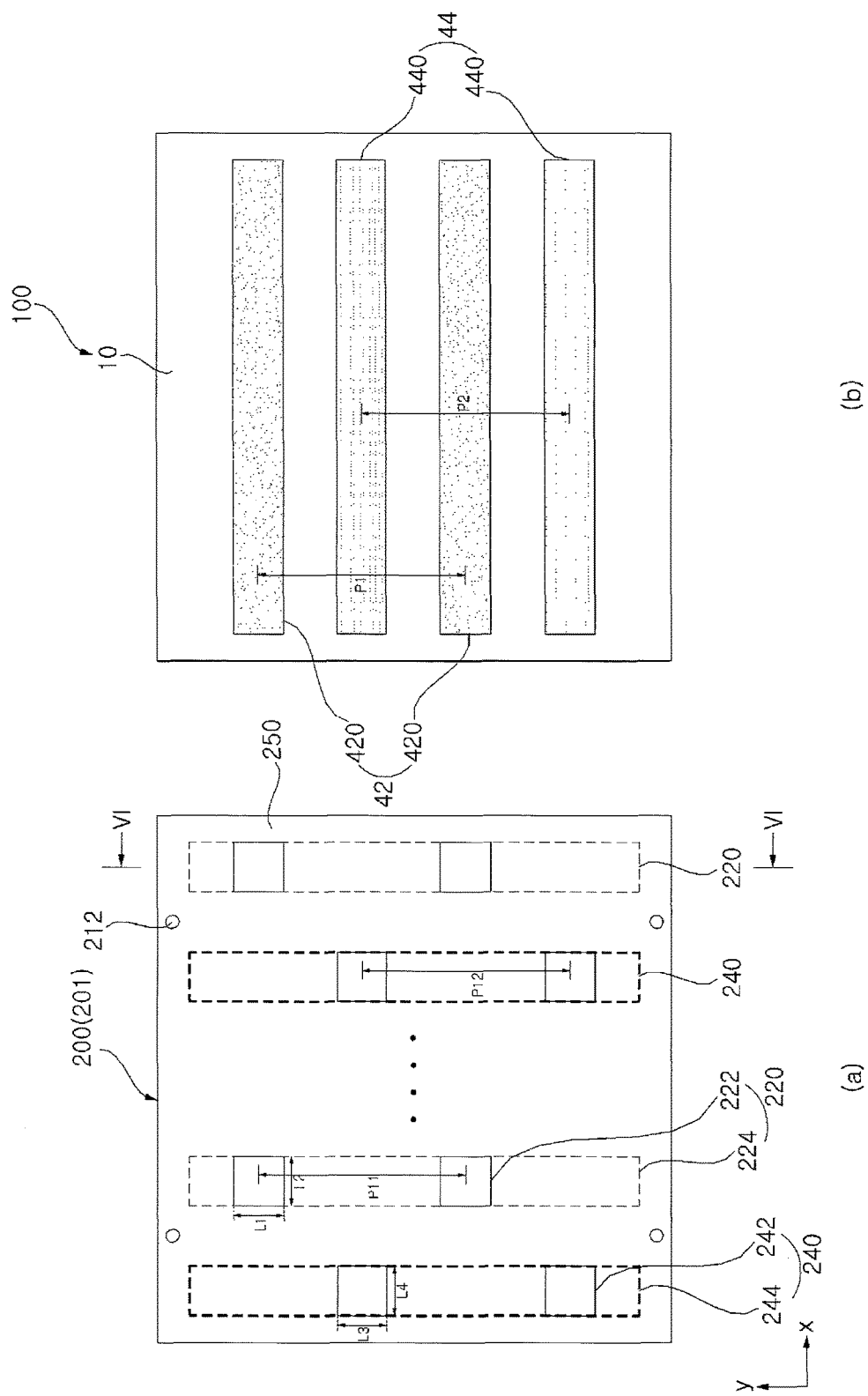
FIG. 5 is a plan view schematically showing the solar cell and the measuring apparatus shown in FIG. 4 respectively.
Figure 6:
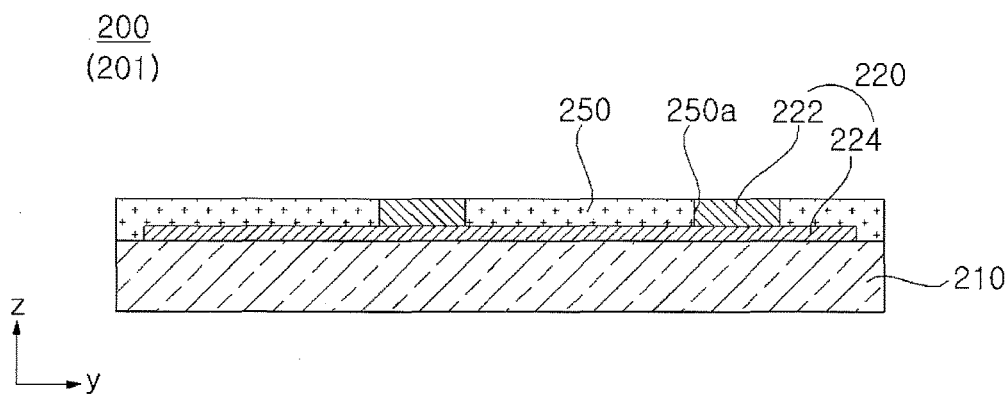
FIG. 6 is a sectional view taken along line VI-VI of FIG. 5.

FIG. 4 is a perspective view schematically showing the solar cell 100 and the measuring apparatus 200 according to the embodiment of the invention, and FIG. 5 is a plan view schematically showing the solar cell 100 and the measuring apparatus 200 shown in FIG. 4 respectively. For brief and clear illustration, in FIGS. 4 and 5, among constituent elements of the solar cell 100, only the semiconductor substrate 10, the first electrode portions 420 of the first electrode 42 and the second electrode portions 440 of the second electrode 44 are shown. In addition, (a) of FIG. 5 shows a surface of the measuring apparatus 200 opposite the solar cell 100, and (b) of FIG. 5 shows a surface of the solar cell 100 opposite the measuring apparatus 200. FIG. 6 is a sectional view taken along line VI-VI of FIG. 5.

Referring to FIGS. 4 to 6, the measuring apparatus 200 according to the embodiment of the invention includes a measuring unit 201 in which measuring members 220 and 240 are formed on a plate-shaped support member 210, the measuring members 220 and 240 respectively including measuring portions 222 and 242 to come into contact with the electrodes 42 and 44 of the solar cell 100. More specifically, the measuring unit 201, which directly participates in measurement of the measuring apparatus 200, may take the form of a plate that includes the support member 210 and the measuring members 220 and 240 having the measuring portions 222 and 242 in the form of a given pattern of pads disposed on the support member 210. In the embodiment of the invention, the measuring portions 222 and 242 may protrude from the support member 210.

More specifically, the support member 210 provides a space to allow the measuring members 220 and 240 to be formed on and fixed to the support member 210. The support member 210 has a plate shape to allow the measuring members 220 and 240 (or the measuring portions 222 and 242) to be stably formed at desired positions to have an appropriate pattern. The support member 210 may be formed of an insulating material to prevent, e.g., unnecessary electrical short between the measuring portions 222 and 242 and to reinforce the strength of the measuring members 220 and 240 for stable formation thereof. For example, the support member 210 may be formed of any of various insulating resins.

The support member 210 in the form of a plate serves to stably support the measuring portions 222 and 242 or the measuring members 220 and 240 including the measuring portions 222 and 242. In this instance, the support member 210 may have an entirely even thickness and may have a rectangular planar shape to have a size corresponding to the entire solar cell 100 or part of the solar cell 100. For example, the support member 210 may be a single plate configured to support all of the measuring portions 222 and 242 or the measuring members 220 and 240 including the measuring portions 222 and 242. As such, the support member 210 may be simplified in configuration and achieve excellent strength. However, the embodiment of the invention is not limited thereto, and the support member 210 may be altered in various ways in terms of a thickness, shape, size and the like thereof.

In the embodiment of the invention, as described above, as the support member 210 takes the form of a plate and the measuring portions 222 and 242 of the measuring members 220 and 240 take the form of a pattern or pad structure that is formed on the support member 210 and has a prescribed surface area, the measuring apparatus 200 may have an approximately plate shape. As such, the measuring apparatus 200 (particularly, the measuring portions 222 and 242) stably come into close contact with the solar cell 100, which may prevent damage to the solar cell 100 due to the measuring apparatus 200.

The support member 210 may have air exhaust holes 212. When air between the measuring apparatus 200 and the solar cell 100 is exhausted through the air exhaust holes 212 in a state in which the measuring portions 222 and 242 of the measuring apparatus 200 come into contact with the electrodes 42 and 44 of the solar cell 100, a gap between the measuring apparatus 200 and the solar cell 100 may remain a vacuum. This ensures close contact between the measuring portions 222 and 242, and the electrodes 42 and 44, thereby minimizing damage, deformation and other problems of the measuring apparatus 200 and the solar cell 100 and achieving enhanced measurement accuracy. The air exhaust holes 212 may be positioned so as not to overlap the measuring members 220 and 240. In one example, the air exhaust holes 212 may be symmetrically positioned on the basis of the center of the support member 210. As such, fixing stability of the measuring apparatus 200 and the solar cell 100 may be further enhanced via air exhaust through the air exhaust holes 212.

In the embodiment of the invention, the measuring members 220 and 240 may respectively include a plurality of first measuring members 220 corresponding to the first electrode 42 and a plurality of second measuring members 240 corresponding to the second electrode 44. The first measuring members 220 may be spaced apart from one another by a constant distance, and the second measuring members 240 may be spaced apart from one another by a constant distance.

In this instance, each of the first measuring members 220 may include a plurality of first measuring portions 222 corresponding to the first electrode portions 420 in a one to one ratio and first connecting portions 224 for connection between the first measuring portions 222. Each of the first measuring portions 222 has a front surface parallel to an upper surface of the corresponding first electrode portion 420 to come into contact with the first electrode portion 420. In this instance, the first connecting portions 224 connect the first measuring portions 222 to one another in a direction crossing the first electrode portions 420 (along the y-axis in the drawing). Similarly, each of the second measuring members 240 may include a plurality of second measuring portions 242 corresponding to the second electrode portions 440 in a one to one ratio and second connecting portions 244 for connection between the second measuring portions 242. Each of the second measuring portions 242 has a front surface parallel to an upper surface of the corresponding second electrode portion 440 to come into contact with the second electrode portion 440. In this instance, the second connecting portions 244 connect the second measuring portions 242 to one another in a direction crossing the second electrode portions 440 (along the y-axis in the drawing).

In the embodiment of the invention, the first and second measuring members 220 and 240 may be configured into a conductive layer formed on the support member 210. More specifically, the first connecting portions 224 of the first measuring member 220 may be connected to one another to extend by a long length on the support member 210 and the first measuring portions 222 may be arranged on the respective first connecting portions 224 to protrude farther from the support member 210 than the first connecting portions 224. The second connecting portions 244 of the second measuring member 240 may be connected to one another to extend by a long length on the support member 210 and the second measuring portions 242 may be arranged on the respective second connecting portion 244 to protrude farther from the support member 210 than the second connecting portion 244.

An insulation layer 250 may be disposed on the remaining part of the support member 210 except for the first and second measuring portions 222 and 242. In particular, the insulation layer 250 may be disposed on the first and second connecting portions 224 and 244 except for the first and second measuring portions 222 and 242. In this way, it is possible to effectively prevent problems caused when the solar cell 100 and the measuring apparatus 200 unnecessarily come into contact with each other at locations except for the first and second measuring portions 222 and 242. In addition, the insulation layer 250 has openings 250a corresponding to the first and second measuring portions 222 and 242, and the first and second measuring portions 222 and 242 are exposed through the openings 250a. In this way, stable electrical connection between the first and second measuring portions 222 and 242, and the first and second electrode portions 420 and 440 may be accomplished.

The first and second measuring members 220 and 240 having the above-described configuration may be fabricated by any of various methods. In one example, first, a conductive layer corresponding to the first and second connecting portions 224 and 244 is formed on the support member 210. The conductive layer may be formed into a desired shape by printing, deposition using a mask, or the like, or may be formed throughout the support member 210 and then patterned into a desired shape. Subsequently, the insulation layer 250 may be formed over the support member 210 to cover the first and second connecting portions 224 and 244. In this instance, the insulation layer 250 may have the openings 250a formed at positions corresponding to the first and second measuring portions 222 and 242. The insulation layer 250 may be formed into a desired shape by printing, deposition using a mask, or the like, or may be formed to cover all of the first and second connecting portions 224 and 244 and the support member 210 and then patterned into a desired shape. Subsequently, the openings 250a of the insulation layer 250 may be filled with a conductive material by plating, deposition, printing or the like to form the first and second measuring portions 222 and 242. In this way, the measuring apparatus 200 may be easily fabricated by stacking the first and second measuring members 220 and 240 on the support member 210.

In another example, a conductive layer is formed on the support member 210. Then, the measuring members 220 and 240 having the above-described configuration may be formed by removing a specific area of the conductive layer (i.e. an area between the first measuring member 220 and the second measuring member 240) in a thickness direction and then removing a specific area of the conductive layer (i.e. an area corresponding to the first and second connecting portions 224 and 244 of the first and second measuring members 220 and 240) in a thickness direction. In this way, the first and second measuring members 220 and 240 may be formed of a single conductive layer. Thereafter, as the insulation layer 250 having the openings 250a is formed, the measuring apparatus 200 having the above-described configuration may be fabricated.

It should be noted that the embodiment of the invention is not limited to the above description and the measuring members 220 and 240 having the above-described configuration may be fabricated by any of various other methods.

In this instance, the respective first connecting portions 224 of the first measuring member 220 may have an even width and may be connected to one another to extend in a straight line form by a long length. The first measuring portions 222 corresponding to the first electrode portions 420 may be formed on the respective first connecting portions 224. The first measuring portions 222 may have the same pitch P1 as or a pitch P11 similar to that of the first electrode portions 420. In addition, the first measuring portions 222 may be shaped to achieve a sufficient contact surface area with the first electrode portions 420. For example, in the embodiment of the invention, a width L1 of each first measuring portion 222, measured in the longitudinal direction of the first connecting portion 224, may be equal to or less than a width of the first electrode portion 420, and a width L2 of the first measuring portion 222, measured in a direction crossing the longitudinal direction, may have a prescribed value. As such, the first measuring portion 222 may have a rectangular planar shape having a given surface area. However, of course, the embodiment of the invention is not limited thereto and the first measuring portion 222 may have any of various other shapes.

Similarly, the respective second connecting portions 244 of the second measuring member 240 may have an even width and may be connected to one another to extend in a straight line form by a long length. The second measuring portions 242 corresponding to the second electrode portions 440 may be formed on the respective second connecting portions 244. The second measuring portions 242 may have the same pitch P2 as or a pitch P12 similar to that of the second electrode portions 440. In addition, the second measuring portions 242 may be shaped to achieve a sufficient contact surface area with the second electrode portions 440. For example, in the embodiment of the invention, a width L3 of each second measuring portion 242, measured in the longitudinal direction of the second connecting portion 244, may be equal to or less than a width of the second electrode portion 440, and a width L4 of the second measuring portion 242, measured in a direction crossing the longitudinal direction, may have a prescribed value. As such, the second measuring portion 242 may have a rectangular planar shape having a given surface area. However, of course, the embodiment of the invention is not limited thereto and the second measuring portion 242 may have any of various other shapes.

As described above, in the embodiment of the invention, the first measuring members 220 extend in a direction (along the y-axis in the drawing) crossing the longitudinal direction of the first electrode portions 420 of the solar cell 100 so as to be located across the first electrode portions 420 (for example, in a direction perpendicular to the first electrode portions 420). Similarly, the second measuring members 240 extend in a direction (along the y-axis in the drawing) crossing the longitudinal direction of the second electrode portions 440 of the solar cell 100 so as to be located across the second electrode portions 440 (for example, in a direction perpendicular to the second electrode portions 440). In addition, the first measuring members 220 and the second measuring members 240 are alternately arranged one by one in the longitudinal direction of the first and second electrode portions 420 and 440 (along the x-axis in the drawing).

With the above-described configuration, the first measuring portions 222 of each of the first measuring members 220 are positioned to correspond to the first electrode portions 420 spaced apart from one another, and the first connecting portions 224 are positioned across locations where the first electrode portions 420 are not formed (i.e. locations where the second electrode portions 440 are formed and locations between the first electrode portions 420 and the second electrode portions 440). The second measuring portions 242 of each of the second measuring members 240 are positioned to correspond to the second electrode portions 440 spaced apart from one another, and the second connecting portions 244 are positioned across locations where the second electrode portions 440 are not formed (i.e. locations where the first electrode portions 420 are formed and locations between the first electrode portions 420 and the second electrode portions 440).

Accordingly, as the first measuring portions 222 of the first measuring member 220 are positioned to correspond to the first electrode portions 420 and the second measuring portions 242 of the second measuring member 240 are positioned to correspond to the second electrode portions 440, the first and second measuring portions 222 and 242 deviate from each other in the longitudinal direction of the measuring members 220 and 240 (along the y-axis in the drawing). This is because the first electrode portions 420 and the second electrode portions 440 are spaced apart from each other in the longitudinal direction of the measuring members 220 and 240 (along the y-axis in the drawing). For example, the first and second measuring portions 222 and 242 of the first measuring member 220 and the second measuring member 240 proximate to each other may be arranged in a zigzag pattern. However, the embodiment of the invention is not limited thereto.

With regard to the first measuring members 220, voltage (i.e. positive voltage when the first electrode 42 is connected to a p-type conductive area or negative voltage when the first electrode 42 is connected to an n-type conductive area) is applied to some of the first measuring members 220 and current (i.e. positive current or negative current) is measured by the other first measuring members 220. As such, in the embodiment of the invention, since the first measuring members 220 to which voltage is applied and the first measuring members 220 at which current is measured are separated from each other, devices for voltage application and current measurement, wiring, and the like may be simplified, which may result in a simplified configuration of the measuring apparatus 200 and a considerably reduced distance between the first measuring members 220. Accordingly, the measuring apparatus 200 may be freely used to measure characteristics of the solar cell 100 in which the electrodes 42 and 44 have small widths and pitches. In addition, the number of the first measuring members 220 to which voltage is applied and the number of the first measuring members 220 at which current is detected may be freely altered, which may enable detection of current at various voltages and minimize resistance.

Similarly, with regard to the second measuring members 240, voltage (i.e. negative voltage when the second electrode 44 is connected to an n-type conductive area or positive voltage when the second electrode 44 is connected to a p-type conductive area) is applied to some of the second measuring members 240 and current (i.e. negative current or positive current) is measured by the other second measuring members 240. As such, in the embodiment of the invention, the second measuring members 240 to which voltage is applied and the second measuring members 240 at which current is measured are separated from each other, which may result in a simplified configuration of the measuring apparatus 200 and a considerably reduced distance between the second measuring members 240. Accordingly, the measuring apparatus 200 may be freely used to measure characteristics of the solar cell 100 in which the electrodes 42 and 44 have small widths and pitches. In addition, the number of the second measuring members 240 to which voltage is applied and the number of the second measuring members 240 at which current is detected may be freely altered, which may enable detection of current at various voltages and minimize resistance.

On the other hand, in the related art, devices for voltage application, devices for current measurement, wirings and the like must be installed to a single bar because voltage must be applied to some of a plurality of pins connected to the single bar and current must be measured at the other pins. Therefore, there are problems of complexity in configuration and limits to reduction in a distance between the pins.

In particular, when a distance between the first electrode portion 420 and the second electrode portion 440 is reduced, effects by reduction in a distance between the first measuring member 220 and the second measuring member 240 may be further enhanced. That is, when the first and second measuring members 220 and 240 cross the first and second electrode portions 420 and 440 as in the embodiment of the invention, a distance between and widths of the first and second measuring members 220 and 240 are not related to a distance between and widths of the first and second electrode portions 420 and 440. Thus, a distance between and widths of the first and second measuring portions 222 and 242 may be freely designed. In this way, precise measurement of current and voltage is possible with respect to the solar cell 100 in which the first and second electrode portions 420 and 440 have small pitches and widths. In particular, according to the embodiment of the invention, even when the solar cell 100 includes only finger electrodes such as the above-described first and second electrode portions 420 and 440 having small widths and pitches without bus-bar electrodes, precise measurement of current and voltage is possible.

On the other hand, when respective measuring members are arranged parallel to electrode portions as in the related art, a distance between the measuring members must be equal or similar to a distance between the electrode portions. Reduction in the distance between the electrode portions requires reduction in the distance between the measuring members and, therefore, there are limits to reduction in the distance between the measuring members due to the above described devices for voltage application and current measurement, wirings and the like. In addition, reduction in widths of the electrode portions causes a reduced surface area of measurement pins or a reduced contact surface area with the pins, which may be liable to cause voltage and current measurement errors. Moreover, aligning the measuring members with the corresponding electrode portions may be considerably difficult.

In addition, in the embodiment of the invention, the first and second measuring portions 222 and 242 may be formed into a prescribed pattern to achieve a sufficient surface area. As such, the first and second measuring portions 222 and 242 may achieve a sufficient contact surface area with the first and second electrode portions 420 and 440, which may minimize resistance and, consequently, enable more precise measurement. In this instance, since the first and second measuring portions 222 and 242 have flat contact surfaces, it is possible to maximally prevent the first and second measuring portions 222 and 242 from causing damage to or deterioration in characteristics of the electrodes 42 and 44 of the solar cell 100. In addition, such a sufficient contact surface area enables precise measurement of current and voltage even in a state in which only some layers of the first and second electrodes 42 and 44 the form of multiple layers are formed (for example, seed layers for formation of the first and second electrodes 42 and 44 are formed).

In addition, as the measuring apparatus 200 is configured in such a manner that the measuring members 220 and 240 are patterned so as to be integrated with the plate-shaped support member 210, the measuring apparatus 200 may achieve convenient handling and stably perform measurement by coming into close contact with the solar cell 100. In addition, the measuring apparatus 200 may more easily perform alignment between the first and second measuring portions 222 and 242, and the first and second electrode portions 420 and 440. This measuring apparatus 200 may be used as a measuring jig.

In addition, according to the embodiment of the invention, current of the solar cell 100 may be stably measured at one surface of the solar cell 100 on which first and second electrodes 42 and 44 are arranged together.

While the above description has been limited to the instance in which the measuring apparatus 200 includes both the first and second measuring members 220 and 240, the embodiment of the invention is not limited thereto. Thus, the measuring apparatus 200 may include only one of the first and second measuring members 220 and 240 and may be used to evaluate characteristics of the solar cell 100 in which the first and second electrodes 42 and 44 are arranged at different surfaces of the solar cell 100. Various other alterations are also possible.

Hereinafter, a measuring apparatus according to another embodiment of the invention will be described in detail. A detailed description related to the same parts as or similar parts to the above description will be omitted and only different parts will be described in detail.

Figure 7:
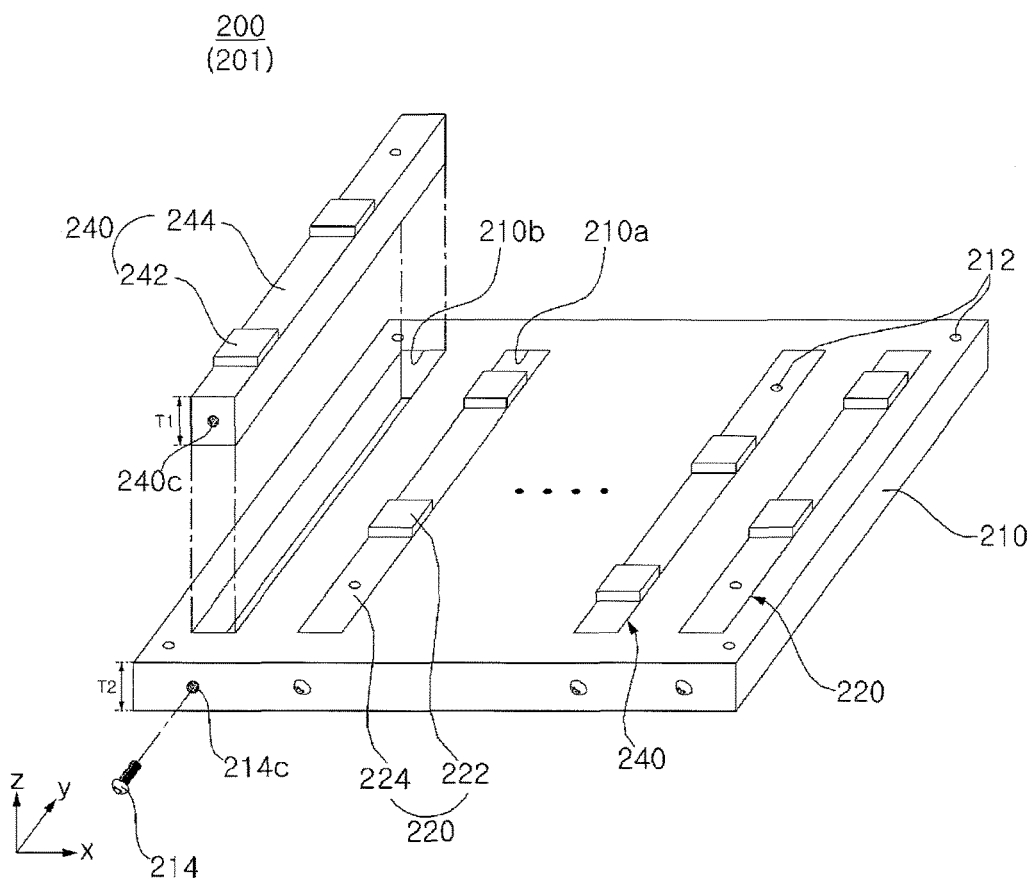
FIG. 7 is a perspective view showing a solar cell measuring apparatus according to another embodiment of the invention.

FIG. 7 is a perspective view showing a measuring apparatus according to another embodiment of the invention.

Referring to FIG. 7, in the measuring apparatus 200 according to the embodiment of the invention, the support member 210, formed of an insulating material, includes first and second holes 210a and 210b corresponding to the first and second measuring members 220 and 240. The first measuring member 220, which takes the form of a block in which the first measuring portions 222 protrude farther from the support member 210 than the first connecting portions 224, is fitted into a corresponding one of the first holes 210a, and the second measuring member 240, which takes the form of a block in which the second measuring portions 242 protrude farther from the support member 210 than the second connecting portions 244, is fitted into a corresponding one of the second holes 210b. In this instance, a thickness T1 of the first and second connecting portions 224 and 244 may be equal or similar to a thickness T2 of the support member 210 and the first and second measuring portions 222 and 242 may protrude from the first and second connecting portions 224 and 244. As such, front and back surfaces of the first and second connecting portions 224 and 244 are disposed on the same plane as a front surface of the support member 210 (facing the solar cell 100) and a back surface of the support member 210 (opposite the solar cell 100), and the first and second measuring portions 222 and 242 protrude from the front surface of the support member 210. In this way, only the first and second measuring portions 222 and 242 may come into contact with the first and second electrode portions (see reference numerals 420 and 440) of the solar cell (see reference numeral 100 of FIG. 4).

In this instance, the first and second measuring members 220 and 240 may be secured to the support member 210 via various configurations and methods. For example, the support member 210 and the first and second measuring members 220 and 240 may be provided with fastening holes 214c and 240c near edges thereof, and fastening members 214, such as screws, bolts or the like, may be fastened through the fastening holes 214c and 240c to secure the first and second measuring members 220 and 240 to the support member 210. As such, the first and second measuring members 220 and 240 may be stably secured to the support member 210 with a simplified configuration. However, the embodiment of the invention is not limited thereto and the first and second measuring members 220 and 240 may be secured to the support member 210 via any of various methods.

When the first and second measuring members 220 and 240 in the form of blocks are separably mounted on the support member 210 as described above, characteristics of the solar cell 100 having various widths and pitches may be measured. That is, through provision of the first and second measuring members 220 and 240 which include the first and second measuring portions 222 and 242 having various sizes and pitches, characteristics of the solar cell 100 may be measured in a state in which the first and second measuring members 220 and 240 suitable for the solar cell 100 to be measured are secured to the support member 210.

The embodiment of the invention illustrates that the support member 210 and the first and second measuring members 220 and 240 are provided with the air exhaust holes 212. The air exhaust holes 212 may be formed in the first and second connecting portions 224 and 244 that are not directly related to measurement of characteristics because the first and second measuring members 220 and 240 penetrate the support member 210. This may allow the measuring apparatus 200 and the solar cell 100 to come into closer contact with each other, resulting in enhanced accuracy of measured characteristics. However, the embodiment of the invention is not limited thereto. That is, as the first and second measuring portions 222 and 242 protrude from the front surface of the support member 210, a space between the front surface of the support member 210 and the contact surfaces of the first and second measuring portions 222 and 242 may serve as an air exhaust space. Various other alterations are also possible.

Figure 8:
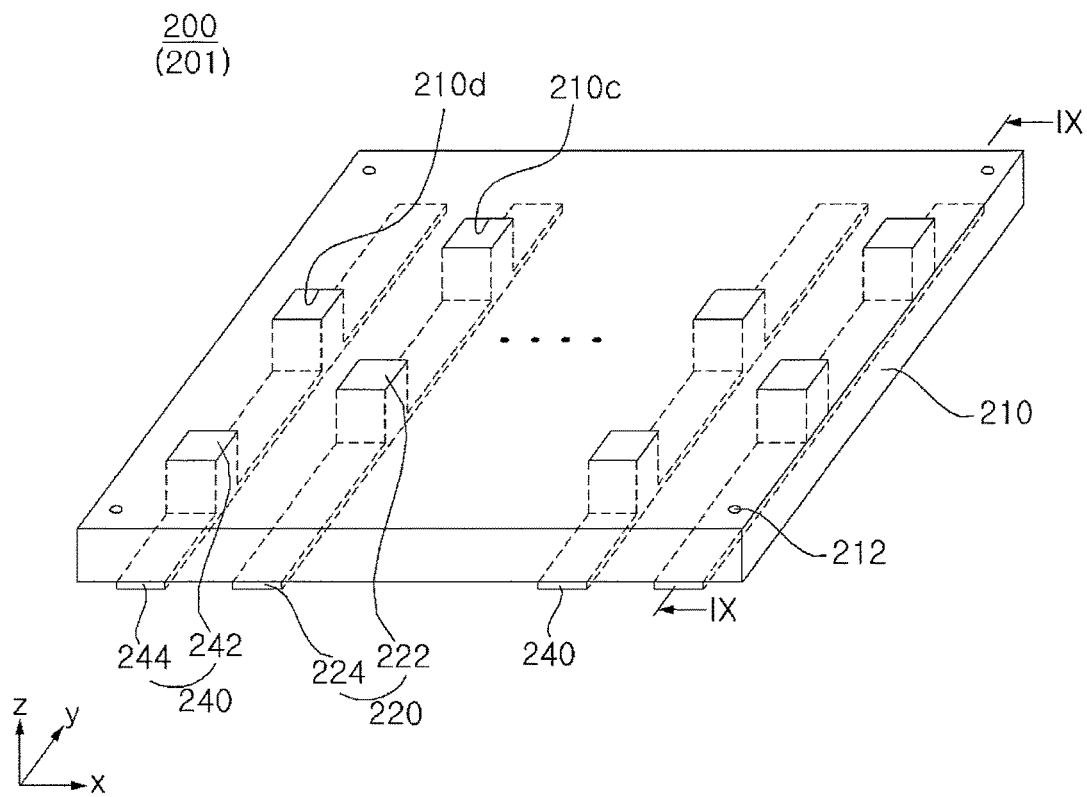
FIG. 8 is a perspective view showing a solar cell measuring apparatus according to another embodiment of the invention.
Figure 9:
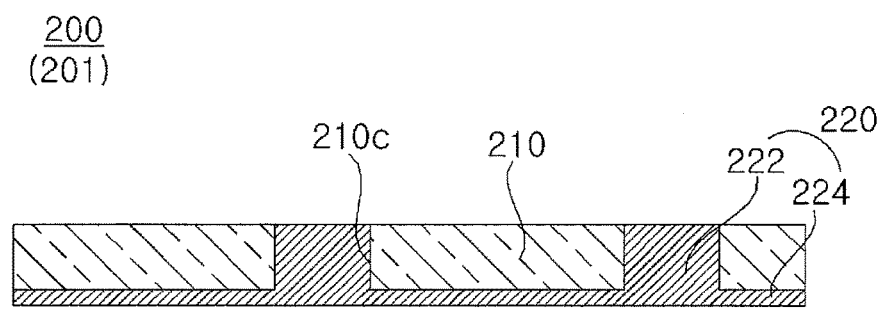
FIG. 9 is a sectional view taken along line IX-IX of FIG. 8.

FIG. 8 is a perspective view showing a measuring apparatus according to another embodiment of the invention, and FIG. 9 is a sectional view taken along line IX-IX of FIG. 8.

Referring to FIGS. 8 and 9, in the measuring apparatus 200 according to the embodiment of the invention, the support member 210 has third and fourth holes 210c and 201d corresponding to the first and second measuring portions 222 and 242.

The first connecting portions 224 of the first measuring member 220 are connected to one another at the back surface of the support member 210 to extend by a long length, and the first measuring portions 222 protrude from the first connecting portions 224 so as to be exposed from the front surface of the support member 210 while filling the third holes 210c. As such, the first measuring portions 222 are disposed on the front surface of the support member 210 to come into contact with the first electrode portions 420. Similarly, the second connecting portions 244 of the second measuring member 240 are connected to one another at the back surface of the support member 210 to extend by a long length, and the second measuring portions 242 protrude from the second connecting portions 244 so as to be exposed from the front surface of the support member 210 while filling the fourth holes 210d. As such, the second measuring portions 242 are disposed on the front surface of the support member 210 to come into contact with the second electrode portions 440.

In the embodiment of the invention, instead of providing an insulation layer (see reference numeral 250 of FIG. 5), the first and second measuring portions 222 and 224 may be spaced apart from each other using the support member 210 formed of an insulating material. This may improve electrical stability.

While the embodiment of the invention illustrates that the air exhaust holes 212 are formed in the support member 210, the embodiment of the invention is not limited thereto. That is, the first and second measuring portions 222 and 242 may be configured to protrude from the front surface of the support member 210 to allow air to be exhausted through a space between the contact surfaces of the first and second measuring portions 222 and 242, and the front surface of the support member 210. Various other alterations are also possible.

Figure 10:
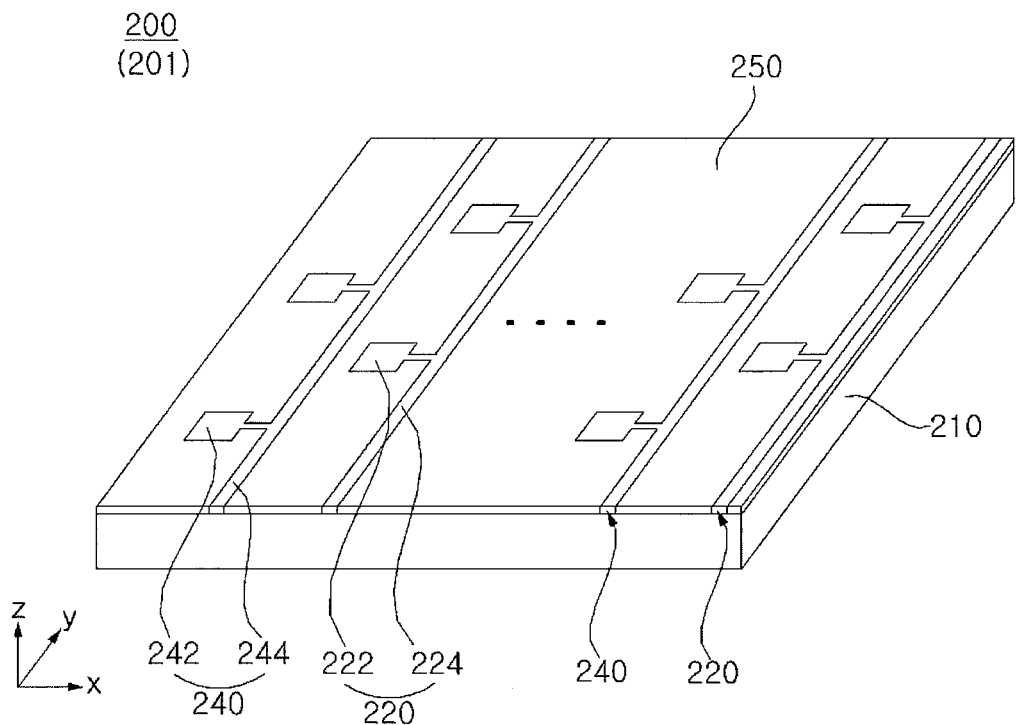
FIG. 10 is a perspective view showing a solar cell measuring apparatus according to another embodiment of the invention.

FIG. 10 is a perspective view showing a measuring apparatus according to another embodiment of the invention.

Referring to FIG. 10, in the embodiment of the invention, the first and second connecting portions 224 and 244 are disposed on the same plane as the first and second measuring portions 222 and 242 and may have substantially the same thickness as the first and second measuring portions 222 and 242. That is, in the embodiment of the invention, the first measuring member 220 is formed to cross the first electrode portions 420, which allows the first electrode portions 420 spaced apart from one another to come into contact with only the first measuring portions 222 even when the first measuring member 220 extends by a long length on the front surface of the support member 210. Similarly, the second measuring member 240 is formed to cross the second electrode portions 440, which allows the second electrode portions 440 spaced apart from one another to come into contact with only the second measuring portions 242 even when the second measuring member 240 extends by a long length on the front surface of the support member 210.

When the first and second connecting portions 224 and 244 and the first and second measuring portions 222 and 242 are placed on the same plane as described above, the first measuring member 220 including the first connecting portions 224 and the first measuring portions 222 and the second measuring member 240 including the second connecting portions 244 and the second measuring portions 242 may be easily and simply formed via formation and subsequent patterning of a conductive layer on the support member 210. This may result in simplified manufacture and enhanced productivity.

Figure 11:
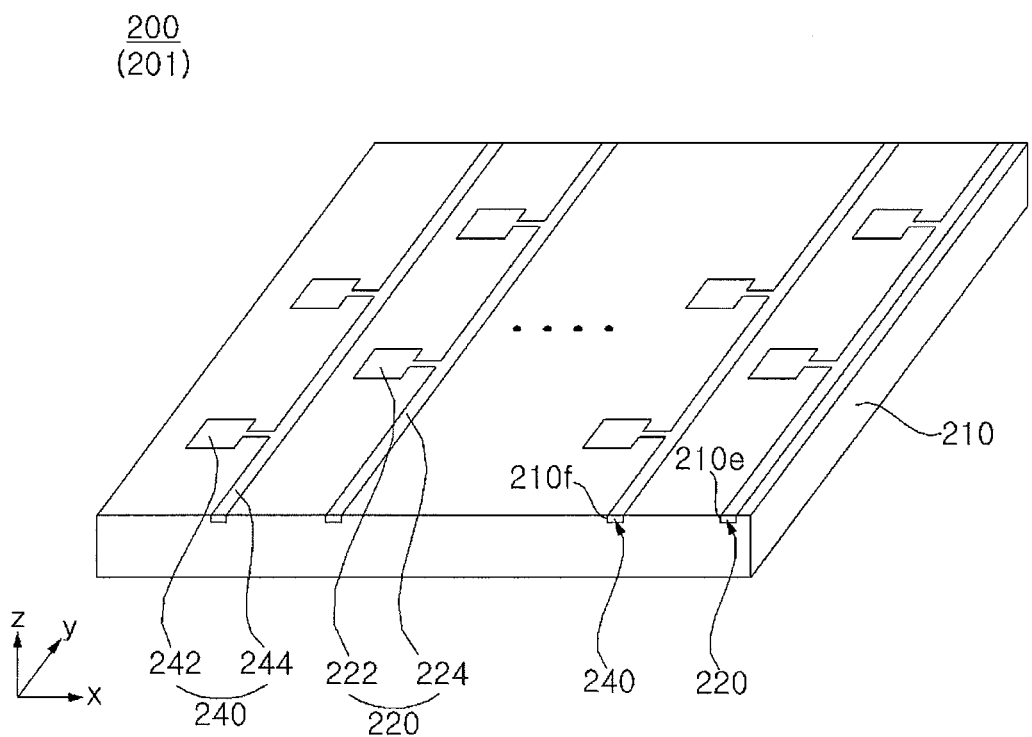
FIG. 11 is a perspective view showing a solar cell measuring apparatus according to another embodiment of the invention.

In addition, the insulation layer 250 may be disposed on the front surface of the support member 210 at locations where the first and second measuring members 220 and 240 are not formed, which may result in enhanced electrical stability. However, the embodiment of the invention is not limited thereto and only the first and second measuring members 220 and 240 may be formed on the support member 210 without the insulation layer 250. Alternatively, as shown by example in FIG. 11, grooves 210e and 210f corresponding to the first and second measuring members 220 and 240 may be formed in the support member 210 and then be filled with a conductive material to form the first and second measuring members 220 and 240. While FIG. 11 illustrates that the first and second measuring portions 222 and 242, and the first and second connecting portions 224 and 244 of the measuring members 220 and 240 received in the grooves 210e and 210f are placed on the same plane, the contact surfaces of the first and second measuring portions 222 and 242 may protrude from the first and second connecting portions 224 and 244 as shown by example in FIGS. 1 to 9. Various other alterations are also possible.

When the first and second connecting portions 224 and 244 and the first and second measuring portions 222 and 242 are placed on the same plane as described above, the first and second measuring members 220 and 240 may be formed via a simplified process.

Figure 12:
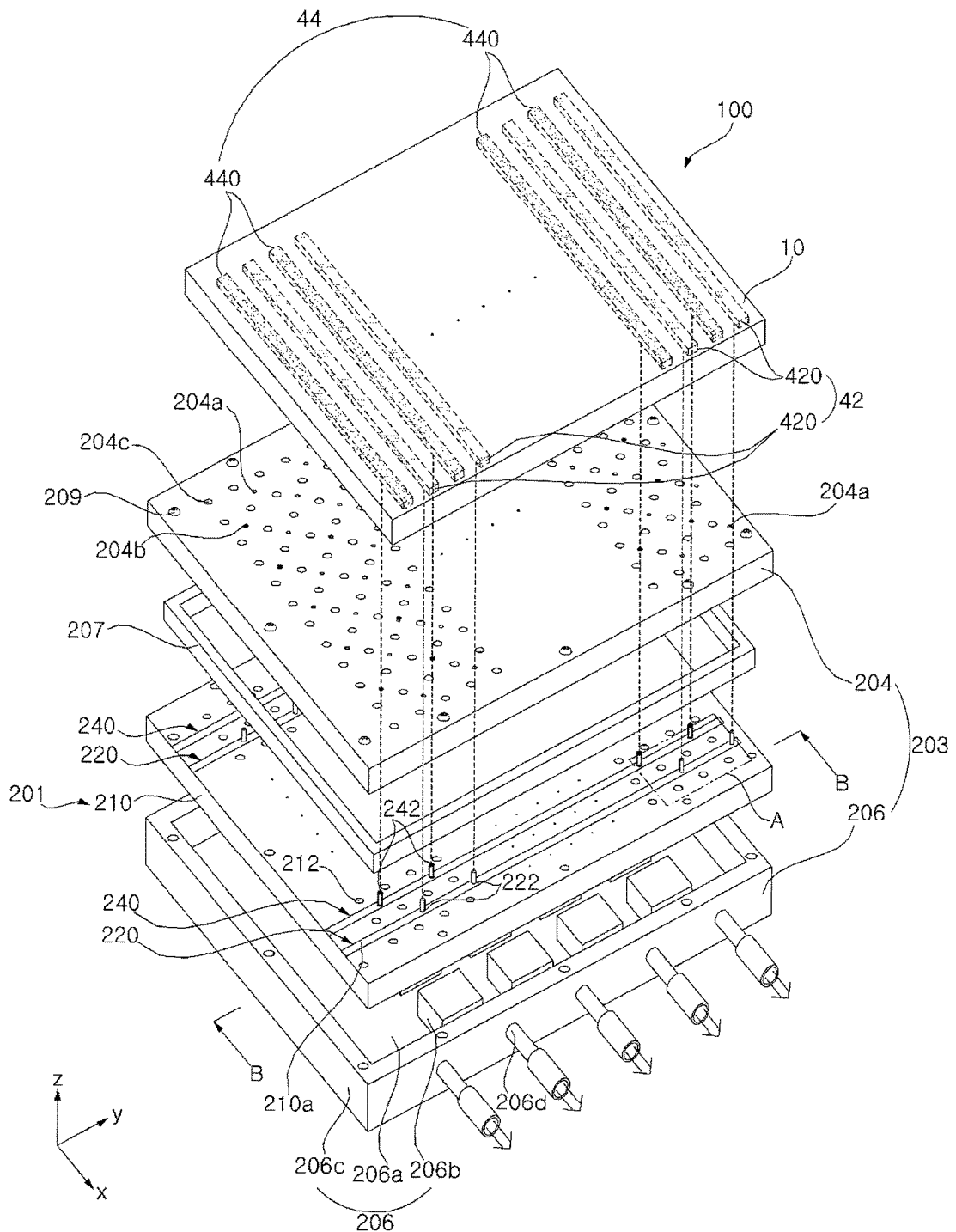
FIG. 12 is a perspective view schematically showing the solar cell as well as a measuring apparatus according to another embodiment of the invention.
Figure 13:
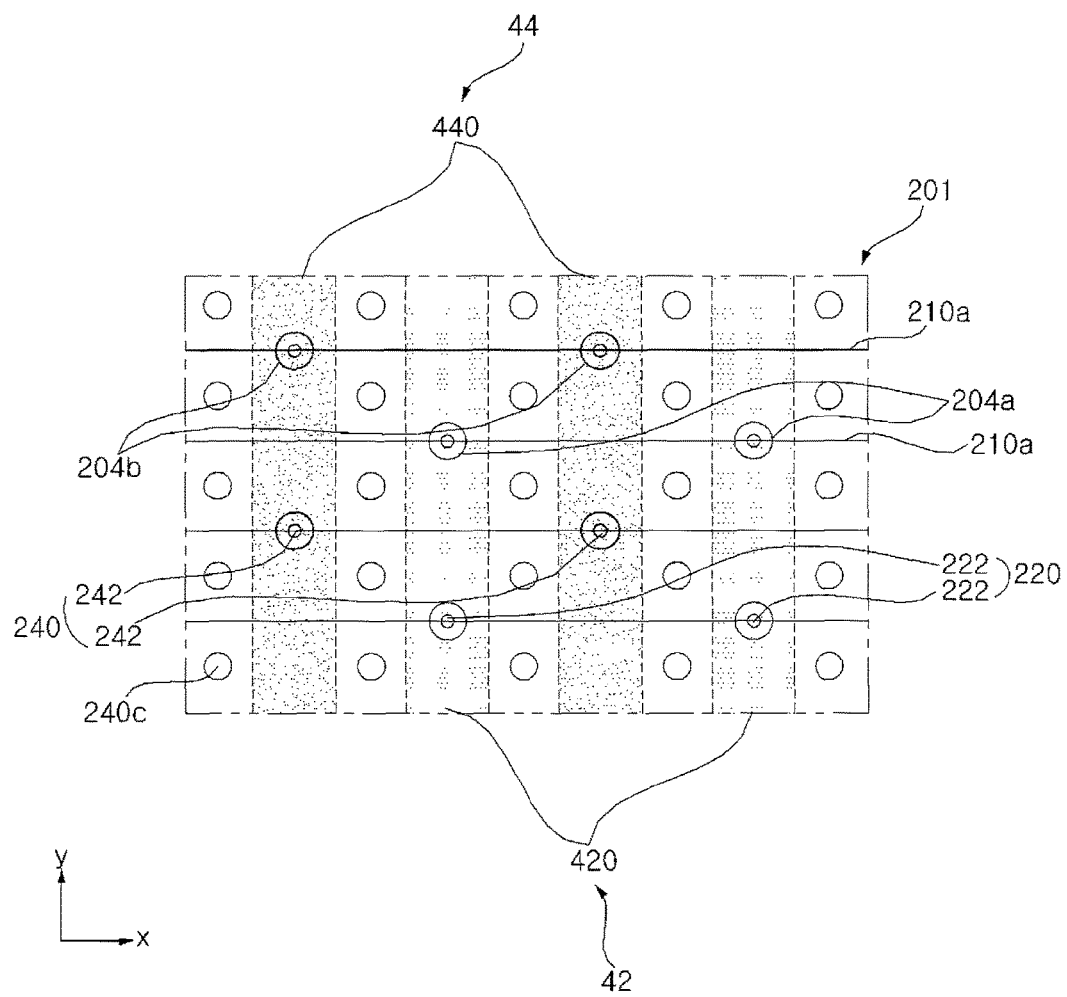
FIG. 13 is a plan view of portion A of FIG. 12.
Figure 14:
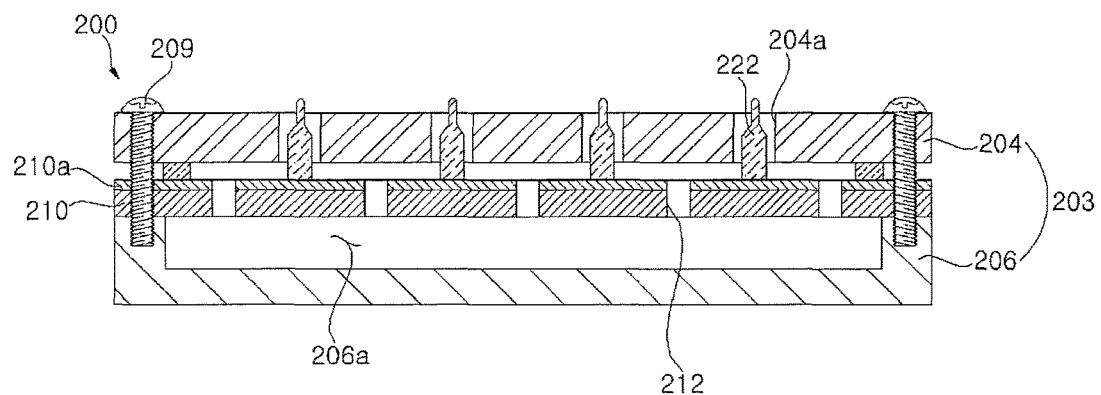
FIG. 14 is a sectional view taken along line B-B of FIG. 12.
Figure 15:
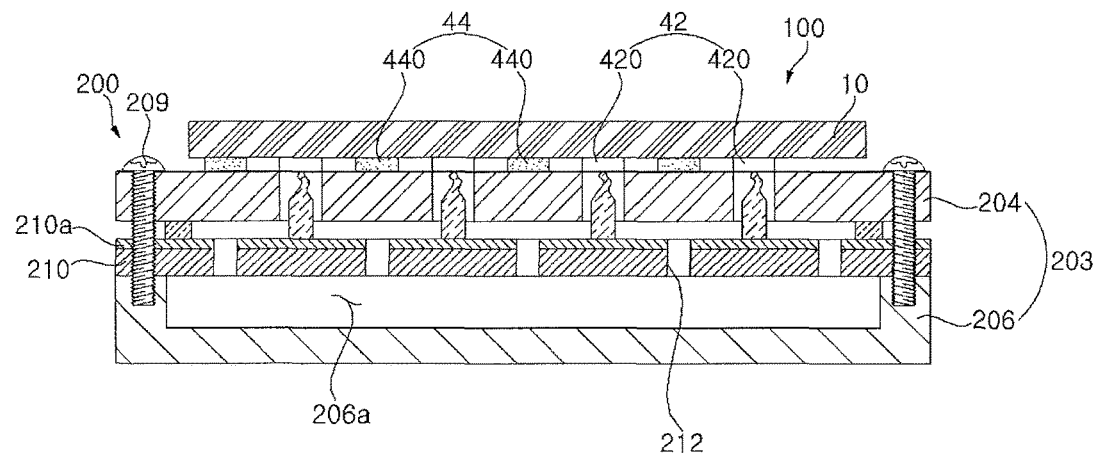
FIG. 15 is a sectional view showing measurement of current-voltage properties of the solar cell disposed on the measuring apparatus shown in FIG. 12.

FIG. 12 is a perspective view schematically showing the measuring apparatus 200 according to another embodiment of the invention, FIG. 13 is a plan view of portion A of FIG. 12, and FIG. 14 is a sectional view taken along line B-B of FIG. 13. In addition, FIG. 15 is a sectional view showing measurement of current/voltage characteristics of the solar cell 100 placed on the measuring apparatus 200 shown in FIG. 12. For brief and clear illustration, among constituent elements of the solar cell 100, only the semiconductor substrate 10, the first electrode portions 420 of the first electrode 42 and the second electrode portions 440 of the second electrode 44 are shown. In addition, for clear understanding, in FIG. 13, only the electrode portions 420 and 440 of the electrodes 42 and 44, the measuring members 220 and 240 and vacuum induction holes 204a and 204b are shown.

Referring to FIGS. 12 to 14, the measuring apparatus 200 according to the embodiment of the invention may include the measuring unit 201, which includes the measuring portions 222 and 242 configured to come into contact with the electrodes 42 and 44 of the solar cell 100 and is directly related to measurement of characteristics of the solar cell 100, and a vacuum unit 203 which applies a vacuum to allow the measuring unit 201 to come into close contact with the solar cell 100. In this instance, the vacuum unit 203 includes a vacuum inducer 204 disposed on a first surface (an upper surface of the drawing) of the measuring unit 201 on which the solar cell 100 is seated, the vacuum inducer 204 providing air exhaust passages for creation of a vacuum around the measuring portions 222 and 242. In addition, the vacuum unit 203 may further include a vacuum chamber 206 disposed on a second surface (a lower surface of the drawing) of the measuring unit 201 opposite the first surface, the vacuum chamber 206 applying a vacuum to the air exhaust passages of the vacuum inducer 204 by exhausting air through the air exhaust passages. This will be described below in more detail.

In the embodiment of the invention, the measuring portions 222 and 242 of the measuring unit 201 are formed on the plate-shaped support member 210. That is, the measuring unit 201 may include the support member 210 and the measuring portions 222 and 242 disposed on the support member 210. As such, in the embodiment of the invention, the measuring unit 201 is configured in such a manner that the measuring members 220 and 240 are integrated with the plate-shaped support member 210, which may provide the measuring apparatus 200 with a more simplified and stable configuration than a conventional bar-shaped measuring apparatus.

The plate-shaped support member 210 serves to stably support the measuring portions 222 and 242. In this instance, the support member 210 may have an entirely even thickness and may have a rectangular planar shape to have a size corresponding to the entire solar cell 100 or part of the solar cell 100. For example, the support member 210 may be a single plate configured to support all of the measuring portions 222 and 242. As such, the support member 210 may be simplified in configuration and achieve excellent strength. However, the embodiment of the invention is not limited thereto, and the support member 210 may be altered in various ways in terms of a thickness, shape, size and the like thereof.

In addition, in the embodiment of the invention, the support member 210 may include a wiring 210a for transmission of measured current, voltage and the like from the measuring portions 222 and 242. That is, the support member 210 may include the wiring 210a to connect the measuring portions 222 and 242 to an external current meter, an external voltage source and the like. The remaining part of the support member 210 except for the wiring 210a may be formed of an electrically insulating material. For example, in the embodiment of the invention, the support member 210 may be a printed circuit board (PCB). When the support member 210 includes the wiring 210a, additional components for fixing and/or electrical connection of the measuring portions 222 and 242 are not necessary, which may maximally simplify a configuration of the measuring unit 201.

The support member 210 may have the air exhaust holes 212. The air exhaust holes 212 of the support member 210 may be arranged at various positions to exhaust air inside the air exhaust passages formed in the vacuum inducer 204. For example, the air exhaust holes 212 may be densely distributed throughout the support member 210. In this instance, the air exhaust holes 212 may be formed at locations where the measuring portions 222 and 242 or the measuring members 220 and 240 and the wiring 210a are not formed. As such, air inside the air exhaust passages of the vacuum inducer 204 may be easily exhausted, which may allow the measuring portions 222 and 242 to come into close contact with the electrodes 42 and 44 of the solar cell 100, resulting in enhanced measurement accuracy.

The measuring portions 222 and 242 secured to the support member 210 may be arranged to construct the measuring members 220 and 240 each extending by a long length in a row. That is, each of the measuring members 220 and 240 may include the measuring portions 222 or 242 arranged in a row in the longitudinal direction thereof (along the y-axis in the drawing), and the measuring members 220 and 240 may be arranged in parallel in a direction crossing the longitudinal direction thereof (e.g., in a direction perpendicular to the longitudinal direction or along the x-axis in the drawing). As described above, in the embodiment of the invention, additional components for fixing and/or electrical connection of the measuring portions 222 and 242 are not necessary because the measuring portions 222 and 242 are secured to the support member 210 having the wiring 210a. In one example, the measuring portions 222 and 242 may be immovably secured to the support member 210 having the wiring 210a via welding or the like. In another example, the measuring portions 222 and 242 may simply rest in the vacuum induction holes 204a and 204b of the vacuum inducer 204 without fixing. In this instance, the vacuum inducer 204 may function as a physical seat for the measuring portions 222 and 242.

The embodiment of the invention illustrates that the measuring portions 222 and 242 protrude from the support member 210. For example, the measuring portions 222 and 242 may be elastic metal pins. As such, the measuring portions 222 and 242 may be deformed to prevent damage to the electrodes 42 and 44 while achieving strong contact with the electrodes 42 and 44 upon measurement of characteristics of the solar cell 100. This will be described below in more detail with reference to FIGS. 14 and 15. In this way, as a result of the measuring portions 222 and 242 coming into close contact with the electrodes 42 and 44 without requiring any elastic member for shock absorbing therebetween, the measuring portions 222 and 242 may have a simplified configuration. However, the embodiment of the invention is not limited thereto and the measuring portions 222 and 242 may be provided with elastic members (e.g., springs). In addition, as shown by example in FIG. 17, the measuring portions 222 and 242 may be configured into electrode pads having wide and flat surfaces.

In the embodiment of the invention, the measuring members 220 and 240 may include the first measuring members 220 including the first measuring portions 222 corresponding to the first electrode 42 and the second measuring members 240 including the second measuring portions 242 corresponding to the second electrode 44. The first measuring members 220 may be spaced apart from one another by a constant distance and the second measuring members 240 may be spaced apart from one another by a constant distance.

The first measuring portions 222 of the first measuring members 220 may be electrically connected to one another in a direction crossing the longitudinal direction of the electrodes 42 and 44 of the solar cell 100 by the wiring 210a of the support member 210. Similarly, the second measuring portions 242 of the second measuring members 240 may be electrically connected to one another in a direction crossing the longitudinal direction of the electrodes 42 and 44 of the solar cell 100 by the wiring 210a of the support member 210.

In the embodiment of the invention, as described above, the first measuring members 220 extend in a direction crossing the longitudinal direction of the first electrode portions 420 of the solar cell 100 (along the y-axis in the drawing) to thereby be arranged across the first electrode portions 420 (in a direction perpendicular to the first electrode portions 420). Similarly, the second measuring members 240 extend in a direction crossing the longitudinal direction of the second electrode portions 440 of the solar cell 100 (along the y-axis in the drawing) to thereby be arranged across the second electrode portions 440 (in a direction perpendicular to the second electrode portions 440). In addition, the first measuring members 220 and the second measuring members 240 are alternately arranged one by one in the longitudinal direction of the first and second electrode portions 420 and 440 (along the x-axis in the drawing).

With the above-described configuration, as shown by example in FIG. 13, the first measuring portions 222 of each first measuring member 220 are positioned to correspond to the first electrode portions 420 spaced apart from one another, and the second measuring portions 242 of each second measuring member 240 are positioned to correspond to the second electrode portions 440 spaced apart from one another. As such, the first and second measuring portions 222 and 242 deviate from each other in the longitudinal direction of the measuring members 220 and 240 (along the y-axis in the drawing). This is because the first electrode portions 420 and the second electrode portions 440 are spaced apart from each other in the longitudinal direction of the measuring members 220 and 240 (along the y-axis in the drawing). For example, the first and second measuring portions 222 and 242 of the first measuring members 220 and the second measuring members 240 proximate to each other may be arranged in a zigzag pattern. However, the embodiment of the invention is not limited thereto.

With regard to the first measuring members 220, voltage (i.e. positive voltage when the first electrode 42 is connected to a p-type conductive area or negative voltage when the first electrode 42 is connected to an n-type conductive area) may be applied to some of the first measuring members 220. In addition, current (i.e. positive current or negative current) is measured by the other first measuring members 220. As such, in the embodiment of the invention, since the first measuring members 220 to which voltage is applied and the first measuring members 220 at which current is measured are separated from each other, devices for voltage application and current measurement, the wiring 210a, and the like may be simplified. As such, it is possible to considerably reduce a distance between the first measuring members 220 and to simplify a configuration of the measuring unit 201. Accordingly, the measuring apparatus 200 may be freely used to measure characteristics of the solar cell 100 in which the electrodes 42 and 44 have small widths and pitches. In addition, the number of the first measuring members 220 to which voltage is applied and the number of the first measuring members 220 at which current is detected may be freely altered, which may enable detection of current at various voltages and minimize resistance.

Similarly, with regard to the second measuring members 240, voltage (i.e. negative voltage when the second electrode 44 is connected to an n-type conductive area or positive voltage when the second electrode 44 is connected to a p-type conductive area) may be applied to some of the second measuring members 240, and current (i.e. negative current or positive current) is measured by the other second measuring members 240. As such, in the embodiment of the invention, the second measuring members 240 to which voltage is applied and the second measuring members 240 at which current is measured are separated from each other, which may result in a simplified configuration of the measuring apparatus 200 and a considerably reduced distance between the second measuring members 240. Accordingly, the measuring apparatus 200 may be freely used to measure characteristics of the solar cell 100 in which the electrodes 42 and 44 have small widths and pitches. In addition, the number of the second measuring members 240 to which voltage is applied and the number of the second measuring members 240 at which current is detected may be freely altered, which may enable detection of current at various voltages and minimize resistance.

The measuring portions 222 and 242 of the measuring unit 201 may need to come into close contact with the electrodes 42 and 44 of the solar cell 100, in order to precisely measure characteristics of the solar cell 100. To this end, in the embodiment of the invention, the vacuum unit 203 is provided to allow the measuring portions 222 and 242 to come into close contact with the electrodes 42 and 44. The vacuum unit 203 applies a vacuum via air exhaust, thereby allowing the measuring portions 222 and 242 to come into close contact with the electrodes 42 and 44.

In the same manner as the solar cell 100 according to the above-described embodiment, when the solar cell 100 has a structure (so-called a back-surface electrode structure) in which the first electrode 42 and the second electrode 44 are disposed on the same surface, close contact between the electrodes 42 and 44 of the solar cell 100 and the measuring portions 222 and 242 may have a great effect on measurement accuracy. That is, when the first electrode 42 and the second electrode 44 are disposed on different surfaces, one measuring unit 201 including the measuring portions 222 and 242 may be disposed on the surface where the first electrode 42 is disposed and the other measuring unit 201 including the measuring portions 222 and 242 may be disposed on the surface where the second electrode 44 is disposed. That is, as two measuring units 201 are disposed respectively on both surfaces of the solar cell 100 including the electrodes 42 and 44 to press the solar cell 100 during measurement, the electrodes 42 and 44 and the measuring portions 222 and 242 may smoothly come into close contact with each other. However, in the embodiment of the invention, since the measuring unit 201 is disposed only at one surface when the first electrode 42 and the second electrode 44 are disposed on the same plane, accurate measurement is possible only when the measuring unit 201 comes into close contact with the solar cell 100.

For this reason, in the embodiment of the invention, the measuring apparatus 200 includes the vacuum unit 203 along with the measuring unit 201. As such, close contact between the electrodes 42 and 44 of the solar cell 100 and the measuring portions 222 and 242 may be firmly maintained via a simplified structure. In addition, as a result of causing the electrodes 42 and 44 of the solar cell 100 to come into close contact with the measuring portions 222 and 242 by applying a vacuum rather than applying a pressure to the surface of the solar cell 100 where the electrodes 42 and 44 are not arranged, it is possible to minimize damage to the electrodes 42 and 44.

The vacuum unit 203 may include the vacuum inducer 204 and the vacuum chamber 206 that applies a vacuum to the vacuum inducer 204. In this instance, the vacuum inducer 204 may be disposed on the first surface of the measuring unit 201 on which the solar cell 100 is seated and the measuring portions 222 and 242 are arranged and the vacuum chamber 206 may be disposed on the second surface of the measuring unit 201 such that the vacuum inducer 204 and the vacuum chamber 206 may be arranged with the measuring unit 201 interposed therebetween. As such, the vacuum inducer 204, which is located at the same surface as the measuring portions 222 and 242, may have a simplified configuration and allow the measuring portions 222 and 242 to come into close contact with the electrodes 42 and 44. In addition, the vacuum chamber 206, which has a structure for application of a vacuum or must be connected to another vacuum application device (e.g., an air exhaust pump or air exhaust equipment), is not located in proximity to the measuring portions 222 and 242, and the electrodes 42 and 44, which may simplify a configuration of the other surface of the measuring unit 201 opposite the vacuum inducer 204 and the measuring portions 222 and 242.

The vacuum inducer 204 has the vacuum induction holes 204a and 204b perforated therein for penetration of the measuring portions 222 and 242. The vacuum induction holes 204a and 204b may include first vacuum induction holes 204a for penetration of the first measuring portions 222 and second vacuum induction holes 204b for penetration of the second measuring portions 242.

For example, in the embodiment of the invention, the vacuum inducer 204 may take the form of a plate that has a thickness equal to or less than a height of the measuring portions 222 and 242, and the vacuum induction holes 204a and 204b may be perforated in the plate-shaped vacuum inducer 204. The vacuum inducer 204 may be secured to the measuring unit 201 such that the measuring portions 222 and 242 are received in the vacuum induction holes 204a and 204b. In this instance, ends of the measuring portions 222 and 242 may be located at the same height as or protrude from an upper surface of the vacuum inducer 204 (i.e. a surface opposite the support member 210) because the thickness of the vacuum inducer 204 is equal to or less than the height of the measuring portions 222 and 242.

The vacuum induction holes 204a and 204b have a greater planar area than a planar area of the measuring portions 222 and 242 received therein. As such, a space for flow of air may be defined between inner surfaces of the vacuum induction holes 204a and 204b and outer surfaces of the measuring portions 222 and 242. The space may also serve as air exhaust passages. The air exhaust passages have a closed shape when viewed in plan to ensure effective air exhaust in a state in which the measuring apparatus 200 comes into close contact with the solar cell 100. The vacuum induction holes 204a and 204b may have any of various other shapes (e.g., circular and polygonal shapes) so long as they define air exhaust passages around the measuring portions 222 and 242.

In the embodiment of the invention, the vacuum induction holes 204a and 204b correspond to the measuring portions 222 and 242 in a one to one ratio. As such, the measuring portions 222 and 242 respectively have independent closed air exhaust passages surrounding the entire outer surfaces thereof. This enables effective creation of a vacuum around the respective measuring portions 222 and 242, thereby achieving enhanced close contact between the respective measuring portions 222 and 242, and the electrodes 42 and 44 upon measurement of characteristics of the solar cell 100. However, the embodiment of the invention is not limited thereto and the vacuum induction holes 204a and 204b may correspond to the measuring portions 222 and 242. This will be described below in more detail with reference to FIG. 16.

The vacuum induction unit 204 may further include air exhaust holes 204c at locations where the measuring portions 222 and 242 are not formed. The air exhaust holes 204c of the vacuum inducer 204 may enable air exhaust through the vacuum inducer 204. As such, the solar cell 100 may come into close contact with the vacuum inducer 204 at locations except for the measuring portions 222 and 242 upon measurement of characteristics of the solar cell 100, which may allow the solar cell 100 to more effectively come into close contact with the measuring portions 222 and 242. For example, the air exhaust holes 204c may be densely distributed throughout the vacuum inducer 204 and may be positioned to overlap the air exhaust holes 212 of the support member 210. This may enhance air exhaust efficiency via the air exhaust holes 204c of the vacuum inducer 204. However, the embodiment of the invention is not limited thereto and the air exhaust holes 204c of the vacuum inducer 204 may be positioned so as not to overlap the air exhaust holes 212 of the support member 210.

The vacuum inducer 204 may be formed of an insulating material so as not to interfere with current measurement or the like. For example, the vacuum inducer 204 may be formed of a resin that is easily fabricated into any of various shapes. However, the embodiment of the invention is not limited thereto and the vacuum inducer 204 may be formed of any of various other materials.

The vacuum inducer 204 may be secured so as to be spaced apart from the support member 201 of the measuring unit 201 by a given distance. For example, a packing member 207 may be interposed between the vacuum inducer 204 and the support member 210 of the measuring unit 201. The packing member 207 may have a closed planar shape (e.g., a rectangular shape) to surround the vacuum inducer 204 and an edge of the measuring unit 201 so as to isolate and seal a space between the vacuum inducer 204 and the measuring unit 201 from the outside. The packing member 207 may be selected from various known sealing members and, for example, may be an O-ring.

When the packing member 207 is interposed between the vacuum inducer 204 and the support member 210, a space corresponding to a thickness of the packing member 207 may be defined inside the packing member 207 between the vacuum inducer 204 and the support member 210. This may ensure more smooth air exhaust when the vacuum chamber 206 applies a vacuum to the vacuum inducer 204 via exhaust of air from the vacuum inducer 204. When the above-described space is not provided, sufficient air exhaust may not be accomplished because an air exhaust area provided by the respective air exhaust passages and the air exhaust holes 204c and 212 is not sufficient.

While the drawing illustrates that the packing member 207 is interposed only between the measuring unit 201 and the vacuum inducer 204, the packing member 207 may be additionally located between the measuring unit 201 and the vacuum chamber 206. Various other alterations are also possible.

The vacuum chamber 206, which is disposed on the second surface of the measuring unit 201, may have a structure to apply a vacuum or may be connected to a vacuum device in order to apply a vacuum to the vacuum inducer 204. For example, in the embodiment of the invention, the vacuum chamber 206 may have an air exhaust path 206a and protrusions 206b to achieve structural stability by coming into close contact with the support member 210. That is, the vacuum chamber 206 may include an outer rim portion 206c that is open at the top thereof and has a bottom surface and a lateral surface to define an inner space, and the protrusions 206b protruding from the bottom surface. A space between the outer rim portion 206c and the protrusions 206b may serve as the air exhaust path 206a. In addition, the outer rim portion 206c is provided with connection holes 206d in communication with the air exhaust path 206a. The connection holes 206d are connected to a vacuum device.

The vacuum chamber 206 may be formed of any of various materials capable of maintaining a vacuum. Various known materials may be used as a constituent material of the vacuum chamber 206 and, thus, the embodiment of the invention is not limited thereto.

In the embodiment of the invention, the measuring unit 201, the vacuum inducer 204 and the vacuum chamber 206 as described above may be integrated with one another via coupling members 209. In this way, the measuring apparatus 200 may have a simplified configuration and ensures easy measurement thereby.

The embodiment of the invention illustrates that the measuring unit 201, the vacuum inducer 204 and the vacuum chamber 206 are fastened to one another via the coupling members 209 such as screws. In this instance, the coupling members 209 such as screws may be fastened to couple the measuring unit 201, the vacuum inducer 204 and the vacuum chamber 206 to one another at the outside of the packing member 207, so as not to interfere with the space sealed by the packing member 207. Such fastening may ensure integration of the aforementioned components via a simplified configuration and method. However, the embodiment of the invention is not limited thereto and various other configurations and methods may be applied to couple the measuring unit 201, the vacuum inducer 204 and the vacuum chamber 206 to one another.

A method of measuring characteristics of the solar cell 100 using the above-described measuring apparatus 200 will be described below in more detail with reference to FIGS. 14 and 15. As described above, in the embodiment of the invention, a height of the measuring portions 222 and 242 is greater than a thickness of the vacuum inducer 204 such that ends of the measuring portions 222 and 242 slightly protrude from the upper surface of the vacuum inducer 204. When a vacuum is applied by the vacuum chamber 206 in a state in which the electrodes 42 and 44 of the solar cell 100 are aligned with the measuring portions 222 and 242 at the upper side thereof, air is exhausted through the air exhaust passages formed in the vacuum induction holes 204a and 204b of the vacuum inducer 204, creating a vacuum around the measuring portions 222 and 242. This may cause the measuring portions 222 and 242 to come into close contact with the electrodes 42 and 44 of the solar cell 100. In the embodiment of the invention, as shown by example in FIG. 15, the measuring portions 222 and 242 are slightly bent or crumpled to come into close contact with the electrodes 42 and 44 because the measuring portions 222 and 242 are elastic as described above. In this instance, the first measuring members 220 are aligned across the first electrode portions 420 and the second measuring members 240 are aligned across the second electrode portions 440. In such a state, current, voltage and the like of the solar cell 100 are measured using the measuring portions 222 and 242.

As described above, in the embodiment of the invention, the measuring apparatus 200 integrally incorporates the vacuum unit 203 to allow the solar cell 100 to come into close contact with the measuring portions 222 and 242 upon measurement of characteristics of the solar cell 100. This may result in enhanced measurement accuracy and stable measurement and may minimize damage to and deformation of the measuring portions 222 and 242, and the solar cell 100. In particular, upon measurement of the solar cell 100 in which the first electrode 42 and the second electrode 44 are disposed on the same surface, the electrodes 42 and 44 of the solar cell 100 may come into close contact with the measuring portions 222 and 242 even in a state in which the measuring apparatus 200 is located only at one surface of the solar cell 100.

Figure 16:
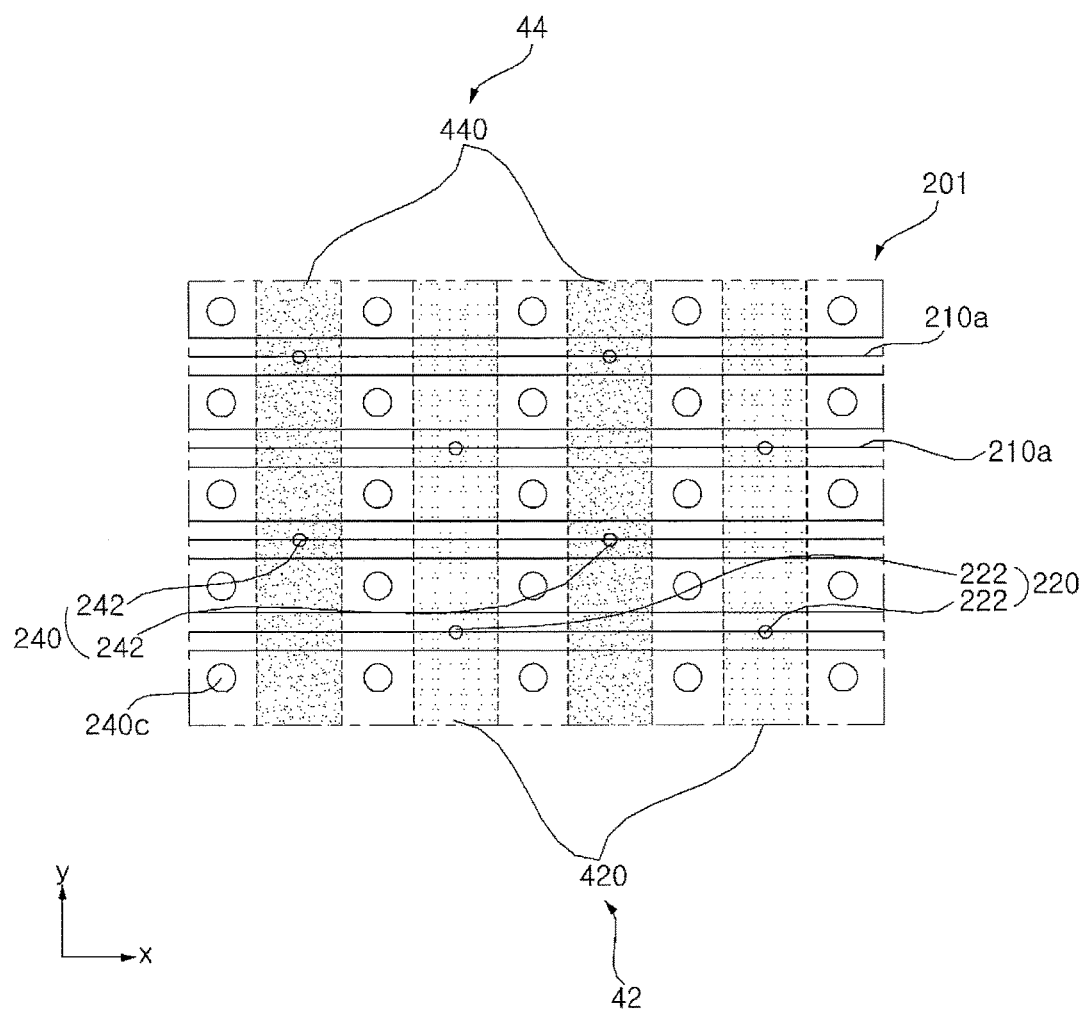
FIG. 16 is a plan view showing a measuring unit and a vacuum inducer included in a measuring apparatus according to another embodiment of the invention.

FIG. 16 is a plan view showing the measuring unit and the vacuum inducer of the measuring apparatus according to another embodiment of the invention. For clear and brief description, in FIG. 16, only parts corresponding to those of FIG. 13 are shown.

Referring to FIG. 16, in the measuring apparatus of the embodiment of the invention, the vacuum induction holes 204a and 204b of the vacuum inducer 204 are positioned to correspond to the respective measuring portions 222 and 242. That is, the measuring portions 222 or 242 are positioned within one vacuum induction hole 204a or 204b. As such, the vacuum induction holes 204a and 204b may have a relatively wide surface area when viewed in plan, which ensures easy formation of the vacuum induction holes 204a and 204b and high air exhaust efficiency.

In the embodiment of the invention, for example, one first vacuum induction hole 204a is elongated in the longitudinal direction of the first measuring member 220 such that the first measuring portions 222 of the first measuring member 220 are located in the first vacuum induction hole 204a. Similarly, one second vacuum induction hole 204b is elongated in the longitudinal direction of the second measuring member 240 such that the second measuring portions 242 of the second measuring member 240 are located in the second vacuum induction hole 204b. As such, the measuring portions 222 or 242, which are arranged in proximity to one another to constitute a single row, are located together within the single vacuum induction hole 204a or 204b, which may minimize deterioration of air exhaust efficiency due to an excessive surface area of the vacuum induction hole 204a or 204b. However, the embodiment of the invention is not limited thereto and one vacuum induction hole 204a or 204b may correspond to the measuring portions 222 or 242 provided in various numbers and arrangements. In one example, one vacuum induction hole 204a or 204b may be provided and all of the measuring portions 222 or 242 may be located in the vacuum induction hole 204a or 204b. In another example, instead of distinguishing the vacuum induction holes 204a and 204b according to the first and second measuring portions 222 and 242, the first and second measuring portions 222 and 242 may be located together in one vacuum induction hole. Various other alterations are also possible.

Figure 17:
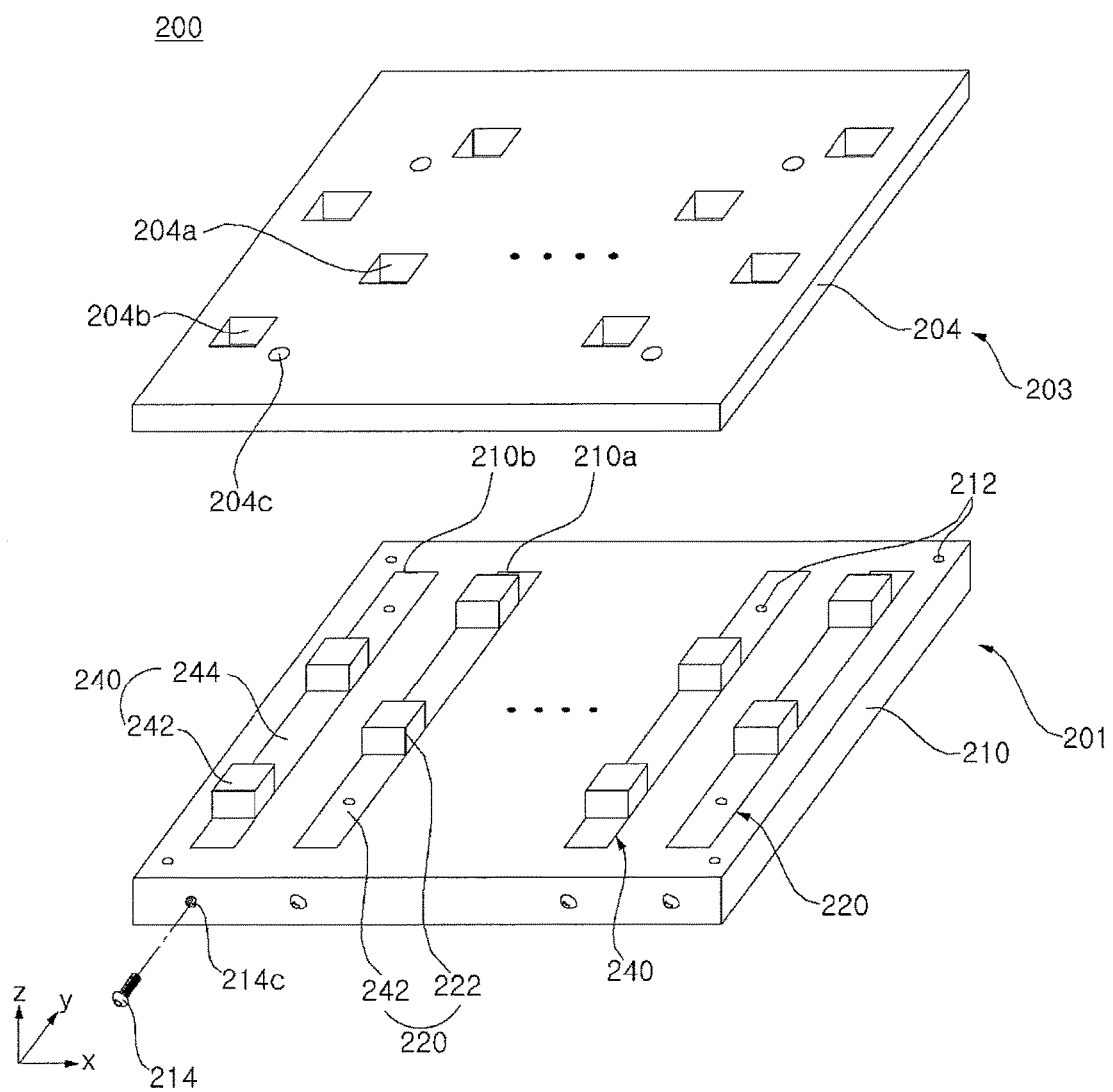
FIG. 17 is a perspective view showing a measuring apparatus according to a further embodiment of the invention.

FIG. 17 is a perspective view showing the measuring apparatus according to a further embodiment of the invention. For clear understanding, in FIG. 17, only the measuring unit and the vacuum inducer are shown. Other parts except for the measuring unit and the vacuum inducer are identical or similar to those of the above description and, thus, description and drawings related thereto will be omitted below.

Referring to FIG. 17, in the measuring unit 201 of the measuring apparatus 200 according to the embodiment of the invention, the measuring portions 222 and 242 may take the form of pads having flat contact surfaces. Even in this instance, the measuring portions 222 and 242 protrude from the support member 210 and, therefore, the vacuum inducer 204 may be disposed on the first surface of the measuring unit 201 such that the protruding measuring portions 222 and 242 are located inside the vacuum inducer 204.

While the drawing illustrates that the vacuum induction holes 204a and 204b of the vacuum inducer 204 correspond to the measuring portions 222 and 242 in a one to one ratio, the embodiment of the invention is not limited thereto. Accordingly, as shown by example in FIG. 16, the measuring portions 222 or 242 may correspond to one vacuum induction hole 204a or 204b.

The above described features, configurations, effects, and the like are included in at least one of the embodiments of the invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the invention as disclosed in the accompanying claims.

What is claimed is:

1. A solar cell measuring apparatus configured to measure a current of a solar cell having a photoelectric converter and first and second electrodes electrically insulated from each other, both the first and second electrodes being located at one surface of the photoelectric converter, the solar cell measuring apparatus comprising:
 a measuring unit including a first measuring member corresponding to the first electrode and a second measuring member corresponding to the second electrode, wherein the first and second measuring members being configured to come into close contact with the solar cell at one surface of the photoelectric converter to measure the current of the solar cell,
 wherein the measuring unit further includes a support member configured to support the first and second measuring members, the first and second measuring members are located at one surface of the support member, the first and second measuring members are patterned to include a plurality of measuring portions respectively, the support member has a plate shape, and the measuring portions are configured into pads.

2. The solar cell measuring apparatus according to claim 1, wherein the measuring portions respectively have flat contact surfaces.

3. The solar cell measuring apparatus according to claim 1, wherein the measuring portions are configured into a conductive layer formed on the support member.

4. The solar cell measuring apparatus according to claim 3, further comprising an insulation layer disposed over the support member to cover the conductive layer, wherein the insulation layer has openings configured to expose the respective measuring portions.

5. The solar cell measuring apparatus according to claim 1, wherein the support member has holes respectively corresponding to the first and second measuring members, and the first and second measuring members are inserted into and fixed in the holes.

6. The solar cell measuring apparatus according to claim 1, wherein the support member has holes respectively corresponding to the measuring portions, at least one of the first and second measuring members further includes a connecting portion configured to connect the respective neighboring measuring portions, and the connecting portion is located at one surface of the support member and the measuring portions protrude from the connecting portion to extend through the holes to thereby be exposed from the other surface of the support member.

7. The solar cell measuring apparatus according to claim 1, wherein the support member has grooves, and the measuring portions are located in the grooves.

8. The solar cell measuring apparatus according to claim 1, wherein at least one of the first and second measuring members further includes a connecting portion configured to connect the respective neighboring measuring portions, and the measuring portions respectively have contact surfaces located on the same plane as the connecting portion or protruding from the connecting portion.

9. The solar cell measuring apparatus according to claim 1, wherein the support member includes a printed circuit board.

10. The solar cell measuring apparatus according to claim 9, further comprising a vacuum unit configured to apply a vacuum so as to allow the measuring portions to come into close contact with the solar cell, wherein the vacuum unit includes a vacuum inducer located at the surface of the support member, the vacuum inducer having a vacuum induction hole providing an air exhaust passage for creation of a vacuum around the measuring portions, the measuring portions are configured into the pins and located in the vacuum induction hole, and the pins are electrically connected to one another via a wiring of the printed circuit board.

11. The solar cell measuring apparatus according to claim 1, further comprising a vacuum unit configured to apply a vacuum so as to allow the measuring portions to come into close contact with the solar cell.

12. The solar cell measuring apparatus according to claim 11, wherein the measuring portions protrude from a solar cell seating surface of the measuring unit, and the vacuum unit includes a vacuum inducer located at the solar cell seating surface, the vacuum inducer having a vacuum induction hole providing an air exhaust passage for creation of a vacuum around the measuring portions.

13. The solar cell measuring apparatus according to claim 12, wherein the vacuum unit further includes a vacuum chamber located at the other surface of the measuring unit opposite the solar cell seating surface, the vacuum chamber serving to maintain a vacuum in the air exhaust passage by exhausting air of the vacuum inducer.

14. The solar cell measuring apparatus according to claim 1, wherein the first electrode includes a plurality of first electrode portions arranged in parallel, the second electrode includes a plurality of second electrode portions arranged in parallel, the first measuring member includes a plurality of first measuring portions corresponding to the first electrode portions, the first measuring portions being electrically connected to one another in a direction crossing the first electrode portions, and the second measuring member includes a plurality of second measuring portions corresponding to the second electrode portions, the second measuring portions being electrically connected to one another in a direction crossing the second electrode portions.

15. The solar cell measuring apparatus according to claim 14, wherein the first electrode portions and the second electrode portions are alternately arranged in a first direction, and the first measuring portions and the second measuring portions are alternately arranged in a second direction crossing the first direction.

16. The solar cell measuring apparatus according to claim 15, wherein the first measuring portions of the first measuring member and the second measuring portions of the second measuring member deviate from each other in the first direction.

17. The solar cell measuring apparatus according to claim 14, wherein the first measuring member includes a plurality of first measuring members, the second measuring member includes a plurality of second measuring members, positive voltage is applied to some of the first measuring members, and positive current is detected by the other first measuring members, and negative voltage is applied to some of the second measuring members, and negative current is detected by the other second measuring members.

\* \* \* \* \*